United States Patent
Wen et al.

(10) Patent No.: US 7,743,306 B2
(45) Date of Patent: Jun. 22, 2010

(54) TEST VECTOR GENERATING METHOD AND TEST VECTOR GENERATING PROGRAM OF SEMICONDUCTOR LOGIC CIRCUIT DEVICE

(75) Inventors: Xiaoqing Wen, Fukuoka (JP); Seiji Kajihara, Fukuoka (JP)

(73) Assignee: Kyushu Institute of Technology, Kitakyushu-shi, Fukuoka (JP)

( * ) Notice: Subject to any disclaimer, the term of this patent is extended or adjusted under 35 U.S.C. 154(b) by 324 days.

(21) Appl. No.: 11/989,487

(22) PCT Filed: Jul. 12, 2006

(86) PCT No.: PCT/JP2006/313848

§ 371 (c)(1),
(2), (4) Date: Jan. 25, 2008

(87) PCT Pub. No.: WO2007/013306

PCT Pub. Date: Feb. 1, 2007

(65) Prior Publication Data

US 2009/0259898 A1    Oct. 15, 2009

(30) Foreign Application Priority Data

Jul. 26, 2005    (JP)    ............................. 2005-215214

(51) Int. Cl.
*G06F 11/00* (2006.01)
(52) U.S. Cl. ....................... 714/739; 714/728
(58) Field of Classification Search .................. 714/741, 714/738, 724, 726, 744, 25, 739, 728; 716/1, 716/4
See application file for complete search history.

(56) References Cited

U.S. PATENT DOCUMENTS

| | | | | |
|---|---|---|---|---|
| 5,305,328 A | * | 4/1994 | Motohara et al. | 714/741 |
| 5,418,792 A | * | 5/1995 | Maamari | 714/738 |
| 5,590,135 A | * | 12/1996 | Abramovici et al. | 714/724 |
| 5,625,630 A | * | 4/1997 | Abramovici et al. | 714/724 |
| 5,737,341 A | * | 4/1998 | Hosokawa | 714/726 |
| 6,327,687 B1 | * | 12/2001 | Rajski et al. | 714/738 |

(Continued)

FOREIGN PATENT DOCUMENTS

JP    4-244979    9/1992

(Continued)

OTHER PUBLICATIONS

M. Abramovici, M. Breuer, and A. Friedman, "Digital Systems Testing and Testable Design", Computer Science Press, 1990.

(Continued)

*Primary Examiner*—David Ton
(74) *Attorney, Agent, or Firm*—McGinn IP Law Group, PLLC

(57) ABSTRACT

The X-type of each bit permutation is determined (step 301). When there are X-types except for X-type 1, i.e., X-type with no don't-care bits, total capture state transition numbers $TECTA_1$ and $TECTA_2$ for capture clock pulses $C_1$ and $C_2$ are calculated (step 303). As a result, when $TECTA_1 > TECTA_2$, an X-type is selected for the capture clock pulse $C_1$ and a first X-filling processing is performed (see step 305). On the other hand, when $TECTA_1 \leq TECTA_2$, an X-type is selected for the capture clock pulse $C_2$ and a second X-filling processing is performed (step 306).

16 Claims, 14 Drawing Sheets

U.S. PATENT DOCUMENTS

| | | | | |
|---|---|---|---|---|
| 6,543,020 B2 * | 4/2003 | Rajski et al. | ............... | 714/738 |
| 6,728,917 B2 * | 4/2004 | Abramovici et al. | ........ | 714/744 |
| 6,751,767 B1 | 6/2004 | Toumiya | | |
| 6,795,948 B2 * | 9/2004 | Lin et al. | ....................... | 716/1 |
| 6,836,856 B2 * | 12/2004 | Blanton | ....................... | 714/25 |
| 6,865,706 B1 * | 3/2005 | Rohrbaugh et al. | ......... | 714/738 |
| 7,000,202 B1 * | 2/2006 | Srinivasan et al. | ............. | 716/4 |
| 7,124,342 B2 * | 10/2006 | Wang et al. | ................. | 714/741 |
| 2004/0250186 A1 | 12/2004 | Takasaki | | |

FOREIGN PATENT DOCUMENTS

| | | |
|---|---|---|
| JP | 2001-99901 | 4/2001 |
| JP | 2004-361351 | 12/2004 |

OTHER PUBLICATIONS

X. Lin, J. Rajski, I. Pomeranz, S. M. Reddy, "On Static Test Compaction and Test Pattern Ordering for Scan Designs", Proc. Intl. Test Conf., pp. 1088-1097, 2001.

S. Kajihara, K. Ishida, and K. Miyase, "Test Vector Modification for Power Reduction during Scan Testing", Proc. VLSI Test Symp., pp. 160-165, 2002.

X. Wen, Y. Yamashita, S. Kajihara, L. Wang, K. K. Saluja, and K. Kinoshita, "On Low-Caputre-Power Test Generation for Scan Testing", Proc. VLSI Test Symp., pp. 265-270, 2005.

R. Sankaralingam, R. Oruganti, and N. Touba, "Static Compaction Techniques to Control Scan Vector Power Dissipation", Proc. VLSI Test Symp., pp. 35-40, 2000.

PCT/IB/326, Feb. 2008.

PCT/IB/338, Feb. 2008.

PCT/IB/373, Jan. 2008.

PCT/ISA/237, Oct. 2006.

English-Language translation of PCT/ISA/237, Oct. 2006.

* cited by examiner

| X-TYPE | NUMBER OF X's | $ppi_1$ | $ppo_1$ | $ppo_2$ | TARGET CAPTURE CLOCK PULSES |
|---|---|---|---|---|---|
| 1 | 0 | $b_1$ | $b_2$ | $b_3$ | ... |
| 2 | | X | $b_2$ | $b_3$ | $C_1$ |
| 3 | 1 | $b_1$ | X | $b_3$ | $C_1, C_2$ |
| 4 | | $b_1$ | $b_2$ | X | $C_2$ |
| 5 | | $b_1$ | X | X | $C_1, C_2$ |
| 6 | 2 | X | $b_2$ | X | $C_1, C_2$ |
| 7 | | X | X | $b_3$ | $C_1, C_2$ |
| 8 | 3 | X | X | X | $C_1, C_2$ |

Each of $b_1$, $b_2$ and $b_3$ represents logic 0 or 1.

TECTA$_1$ = 2.5         TECTA$_2$ = 2.0

(A)

(B)

(A)

(B)

(A)

(B)

(A)

(B)

TEST VECTOR GENERATING METHOD AND TEST VECTOR GENERATING PROGRAM OF SEMICONDUCTOR LOGIC CIRCUIT DEVICE

TECHNICAL FIELD

The present invention relates to a test vector generating method and test vector generating program of a semiconductor logic circuit device for carrying out a real-speed scan test targeting a delay fault.

BACKGROUND TECHNOLOGY

Semiconductor logic circuit devices are shipped through three steps, i.e., a design step, a production step and a test step. In a test step, a test vector is applied to a manufactured semiconductor logic circuit device, to observe a test response from the semiconductor logic circuit device, and to compare the test response with an expected test response, thus determining whether the semiconductor logic circuit device is good or defective. The rate of good semiconductor logic circuit devices is called a manufacturing yield which would remarkably affect the semiconductor logic circuit devices in manufacturing cost.

Generally, a semiconductor logic circuit device (mainly, a sequential circuit) is constructed by a combinational portion formed by logic elements such as AND gates, NAND gates, OR gates and NOR gates, and a flip-flop group storing an internal state of the circuit. In this case, the combinational portion has external input lines PI, pseudo external input lines PPI serving as output lines of the flip-flop group, external output lines PO and pseudo external output lines PPO serving as input lines of the flip-flops. That is, inputs to the combinational portion are ones supplied directly from the external input lines and ones supplied by the pseudo external input lines. Also, outputs from the combinational portion are ones appearing directly at the external output lines and ones appearing at the pseudo external output lines.

In order to test the combinational portion of a semiconductor logic circuit device, a predetermined test vector is required to be applied thereto from the external input lines and the pseudo external input lines of the combinational portion, and a test response is required to be observed from the external output lines and the pseudo external output lines of the combinational portion. Here, one test vector is formed by bits corresponding to the external input lines and the pseudo external input lines. Also, one test response is formed by bits corresponding to the external output lines and the pseudo external output lines.

However, it is generally impossible to directly access the output lines of the flip-flops (the pseudo external input lines) and the input lines of the flip-flops (the pseudo external output lines) in the semiconductor logic circuit device from the exterior. Therefore, in order to test the combinational portion, there are problems in the controllability of the pseudo external input lines and the observability of the pseudo external output lines.

A scan design is a technique for solving the problems of controllability and observability in the test of the combinational portion. Such a scan design replaces the flip-flops (FF) with scan flip-flops (scan FFs) by which one or a plurality of scan chains are formed. The scan flip-flops are controlled by a scan enable signal SE. For example, when SE=0, the scan flip-flops perform the same operation as conventional flip-flops. That is, if a clock pulse is given, the output values of the scan flip-flops are renewed by the combinational portion. On the other hand, when SE=1, the scan flip-flops with the other scan flip-flops within the same scan chain form one shift register. That is, if a clock pulse is given, new values are shifted from the exterior in the scan flip-flops, and simultaneously, values which have been in the scan flip-flops are shifted out to the exterior. Generally, scan flip-flops in the same scan chain share the same scan enable signal SE; however, scan enable signals SE in different scan chains may be the same or different from each other.

FIG. 14 is a circuit diagram for explaining a real speed scan test targeting a delay fault of a combination portion of a scan-designed semiconductor logic circuit device. In FIG. 14, reference numeral 1 designates a semiconductor logic circuit device, and 2 designates a tester.

The semiconductor logic circuit device of FIG. 14 is constructed by a combinational portion 11 formed by logic elements such as AND gates, OR gates, NAND gates, and NOR gates, a flip-flop group 12, a phase-locked loop (PLL) circuit 13 for generating a high-speed clock signal RCLK, and a multiplexer 14 for selecting the real speed clock signal RCLK or a low-speed shift clock signal SCLK supplied from the tester 2 and supplying the selected clock signal to the scan flip-flop group 12. Note that a clock enable signal CE is used for controlling generation of capture pulses from the PLL circuit 13.

The combinational portion 11 has external input lines PI, pseudo external input lines PPI serving as output lines of the scan flip-flop group 12, external output lines PO, and pseudo external output lines PPO serving as input lines of the scan flip-flop group 12. Note that the number of the external input lines PI is not always the same as that of the external output lines PO; however, the number of the pseudo external input lines PPI is always the same as that of the pseudo external output lines PPO.

FIG. 15 is a timing diagram for explaining the real speed scan test of FIG. 14. A real speed scan test is performed by repeating shift operations and two capture operations (hereinafter, referred to as a double-capture operation). The shift operation is performed by a shift mode where a scan enable signal SE is "1". In the shift mode, one or plural low-speed shift clock signals $S_1, \ldots, S_L$ are given so that one or a plurality of new values are shifted in the scan flip-flop group 12 within a scan chain. Simultaneously, one or a plurality of current values in the scan flip-flop group 12 within the scan chain are shifted out to the exterior. Note that a maximum value L is the number of scan flip-flops of the scan flip-flop group 12. Also, even if the shift clock pulses are at a low speed, no problem occurs. On the other hand, the capture operation is performed by a capture mode where the scan enable signal SE is "0". In the shift mode, a clock signal CE is enabled (CE="0"), so that two clock pulses $C_1$ and $C_2$ in response to rising edges of the clock enable signal CE are supplied from the PLL circuit 13 of FIG. 14 to the scan flip-flop group 12 in the one scan chain. Thus, the values at the pseudo external output lines PPO of the combinational portion 11 are taken into all the scan flip-flops of the scan flip-flop group 12. Since the interval $T_2$ of these clock pulses $C_1$ and $C_2$ is determined in accordance with a design specification, the effect of the real speed scan test can be obtained.

A shift operation is used for applying a test vector to the combinational portion 11 through the pseudo external input lines PPI and for observing a test vector from the combinational portion 11 through the pseudo external output lines PPO. Also, a capture operation is used for obtaining a test response of the combinational portion 11 in the scan flip-flop group 12. Shift operations and double-capture operations are repeated upon all test vectors, thus real-speed scan-testing the combinational portion 11. Such a test system is called a real-speed scan test system.

In a real speed scan test, application of a test vector to the combinational portion 11 is formed by a portion applied directly from the exterior input lines PI and a portion applied by shift operations. Since an arbitrary logic value is set in an arbitrary scan flip-flop, the problem of controllability of the pseudo external input lines PPI is solved. On the other hand, observation of a test response from the combinational portion 11 is formed by a portion performed directly from the external output lines PO and a portion performed by shift operations. Since an output value of an arbitrary scan flip-flop can be observed by shift operations, the problem of observability of the pseudo external input lines PPI is solved. Thus, in a real-speed scan test system, it is only necessary to obtain a test vector and an expected test response for the combinational portion 11 by using an automatic test pattern generation (ATPG) program.

Despite the effectiveness of the above-mentioned real speed scan test system, there is a problem in that the power consumption is remarkably larger in a test mode than in a usual operation mode. For example, if the semiconductor logic circuit device is constructed by CMOS circuits, the power consumption consists of static power consumption due to leakage currents and dynamic power consumption due to switching operations of the logic gates and the flip-flops. Additionally, the latter dynamic power consumption consists of shift power consumption in shift operations and capture power consumption in capture operations.

Generally, a large number of clock pulses are required for one test vector in shift operations. For example, in order to set new values in all the scan flip-flops of the scan flip-flop group 12 of a scan chain, a number of clock pulses corresponding to the number of the scan flip-flops are required at most. As a result, the shift power consumption is increased to induce excessive heat. Therefore, semiconductor logic circuit devices would be damaged. Various techniques for decreasing the shift power consumption have been vigorously developed.

On the other hand, generally, two clock pulses per one scan chain are required for one test vector in a double-capture operation. Therefore, heat by the double-capture operation mode creates no problem. However, in a capture mode, when a test response of the combinational portion 11 appearing at the pseudo external output lines PPO is obtained in the scan flip-flop group 12, if the values of the test response are different from the current values of the scan flip-flop group 12, the values of the corresponding scan flip-flop group 12 change. If the number of the scan flip-flop group 12 whose output values have changed, the power supply voltage is instantaneously changed by the switching operation of the logic gates and the scan flip-flops 12. This is also called an IR (I: current and R: resistance) drop phenomenon. The IR drop phenomenon would erroneously operate the circuit resulting in erroneous test response values in the scan flip-flop group 12. Thus, even semiconductor logic circuit devices normally operable in a usual state would be deemed to be defective in a test state, which can be an erroneous test. As a result, the manufacturing yield would be decreased. Particularly, when semiconductor logic circuit devices become ultra-large in scale, more fine-structured and lower in power supply voltage, the manufacturing yield caused by the erroneous test would be remarkably decreased. Therefore, it is essential to decrease the capture power consumption in a double-capture operation for a real speed test.

The capture power consumption can be decreased by a clock gating technique; however, this would remarkably affect the physical design of semiconductor logic circuit devices. Also, the capture power consumption can be decreased by a one hot technique or a multiple clock technique; however, the former technique would remarkably increase test data amount, and the latter technique would require enormous memory consumption in generating test vectors, which is a shortcoming. Therefore, in view of the decrease of the capture power consumption, it is expected to decrease the impact to the physical design, to suppress the increase of test data amount and to decrease the required memory amount.

On the other hand, many test cubes, i.e., input vectors with don't-care bits (hereinafter, referred to as X-bits) are usually generated in a process for generating test vectors using an ATPG program. Also, when a set of test vectors without X-bits are given, some bits of some test vectors can be converted into X-bits without changing the fault detection rate of the set of test vectors. That is, test cubes can be obtained by an X-bit extracting program. The reason for the existence of test cubes is mainly to have only to set necessary logic values in a part of bits of the external input lines PI and the pseudo external input lines PPI in order to detect one target fault in the combinational portion 11. Since assignment of 0's or 1's to the remainder bits does not affect the detection of the target fault, such remainder bits are X-bits for the target fault.

A test cube with X-bits is strictly an intermediate product appearing in a process for generating a test cube without X-bits. Therefore, 0 or 1 finally have to be filled into the X-bits of the test cube by an appropriate method, i.e., an algorithm filling method, a merge filling method or a random filling method.

The algorithm filling method determines and fills optimum logic values (0 or 1) for the X-bits in a test cube in an algorithm in order to obtain an object. Such an algorithm is often included on an ATPG program. This algorithm filling method is used for decreasing the total number of test vectors in dynamic compaction (see: non-patent documents 1 and 2), for decreasing the shift power consumption (see: non-patent document 3) or for decreasing the capture power consumption in a single-capture operation (see: non-patent document 4).

When a test cube is merged with another test cube, the merge filling method fills 0 or 1 in X-bits of the test cubes so that a bit of the test cube has the same logic value as its corresponding bit of the other test cube. For example, in order to merge a test cube 1X0 with a test cube 11$x$, 1 is assigned to the X-bit of the test cube 1X0 and 0 is assigned to the X-bit of the test cube 11$x$. This merge filling method is used for decreasing the total number of test vectors in static compaction (see: non-patent document 1) or for decreasing the shift power consumption (see: non-patent document 5).

The random filling method assigns 0 or 1 randomly to X-bits in a test cube. This random filling method is often performed for remaining X-bits after the algorithm filling method or the merge filling method is performed. This random filling method is used for decreasing the total number of test vectors in dynamic compaction (see: non-patent document 1) or for decreasing the shift power consumption (see: non-patent document 5).

Non-patent document 1: M. Abramovici, M. Breuer, and A. Friedman, Digital Systems Testing and Testable Design, Computer Science Press, pp. 245-246, 1990.

Non-patent document 2: X. Lin, J. Rajski, I. Pomeranz, S. M. Reddy, "On Static Test Compaction and Test Pattern Ordering for Scan Designs", Proc. Intl. Test Conf., pp. 1088-1097, 2001.

Non-patent document 3: S. Kajihara, K. Ishida, and K. Miyase, "Test Vector Modification for Power Reduction during Scan Testing", Proc. VLSI Test Symp., pp. 160-165, 2002.

Non-patent document 4: X. Wen, Y. Yamashita, S. Kajihara, L. Wang, K. K. Saluja, and K. Kinoshita, "On Low-Capture-Power Test Generation for Scan Testing", Proc. VLSI Test Symp., pp. 265-270, 2005.

Non-patent document 5: R. Sankaralingam, R. Oruganti, and N. Touba, "Static Compaction Techniques to Control Scan Vector Power Dissipation", Proc. VLSI Test Symp., pp. 35-40, 2000.

SUMMARY OF THE INVENTION

Problem to be Solved by the Invention

The above-described algorithm filling method, merge filling method and random filling method for filling 0 or 1 in X-bits, however, are intended to decrease the total number of test vectors, decrease the shift power consumption or decrease the single-capture power consumption, so that an erroneous test caused by the increase of the double-capture power consumption cannot be avoided, and thus, the manufacturing yield is decreased, which is a problem.

Therefore, an object of the present invention is to provide a test vector generating method and a test vector generating program of a semiconductor logic circuit device which decreases the double-capture power consumption by decreasing the number of output switching scan flip-flops in a double-capture operation, to reduce the IR drop, thus avoiding an erroneous test.

Means for Solving the Problem

In order to attain the above-mentioned object, in a test vector generating method of a semiconductor logic circuit device comprising a combinational portion having external input lines, pseudo external input lines, external output lines and pseudo external output lines and a scan flip-flop group forming a scan chain connected between the pseudo external output lines and the pseudo external input lines, the combinational portion is hypothetically formed by first and second combinational portions having the external input lines in common, the scan flip-flop group being hypothetically formed by first and second scan flip-flop groups operated by first and second capture clock pulses continuously performed upon the first and second combinational portions. A first filling step fills 0 or 1 in X-bits of a test cube so that the number of discrepancies between bits of the pseudo external input lines and respective bits of the pseudo external output lines of the first combinational portion can be decreased. A second filling step fills 0 or 1 in X-bits of a test cube so that the number of discrepancies between bits of the pseudo external input lines and respective bits of the pseudo external output lines of the second combinational portion. A balancedly discrepancy decreasing step selects the first and second filling steps and repeatedly operates the selected filling step so that the number of discrepancies between bits of the pseudo external input lines of the first combinational portion and respective bits of the pseudo external output lines of the first combinational portion and the number of discrepancies between bits of the pseudo external input lines of the second combinational portion and respective bits of the pseudo external output lines of the second combinational portion are decreased in a balanced manner. A third filling step fills 0 or 1 in all specified bits of the external input lines of the first combinational portion, when there is no X-bit in the pseudo external input lines of the first combinational portion, the pseudo external output lines of the first combinational portion and the pseudo external output lines of the second combinational portion. Thus, the test cube is converted into a test vector having no X-bits.

EFFECT OF THE INVENTION

According to the present invention, since the number of output switching scan flip-flops in a double-capture operation is decreased, the double-capture power consumption can be decreased, thus avoiding an erroneous test caused by the decrease of the power supply voltage due to the IR drop.

BEST MODE CARRYING OUT THE INVENTION

FIG. 1 is a circuit expansion view showing the principle of a test vector generation of a semiconductor logic circuit device according to the present invention.

FIG. 1 is used for explaining the reduction of the power consumption in the case where the semiconductor logic circuit device of FIG. 14 is subjected to double-capture pulses $C_1$ and $C_2$. Therefore, the combinational portion 11 and the scan flip-flop groups 12 of FIG. 14 are hypothetically doubled, i.e., combinational portions $11_1$ and $11_2$ each being the same as the combinational portion 11 and scan flip-flop groups $12_1$ and $12_2$ each being the same as the scan flip-flop group 12 are hypothetically doubled. In this case, external input lines $PI_1$ of the combinational portion $11_1$ serve as external input lines $PI_2$ of the combinational portion $11_2$, and pseudo external output lines $PPO_1$ of the combinational portion $11_1$ serve as pseudo external input lines of the combinational portion $11_2$. Further, the scan flip-flop group $12_1$ is subjected by the capture clock pulse $C_1$ to a capture operation, and the scan flip-flop group $12_2$ is subjected by the capture clock signal $C_2$ to a capture operation.

In FIG. 1, a number $N_1$ of differences in bit between the pseudo external input lines PPI, and the pseudo external output lines $PPO_1$ and a number $N_2$ of differences in bit between the pseudo external output lines $PPO_1$ and the pseudo external output lines $PPO_2$ are decreased in a balanced manner to suppress the reduction of a power supply voltage $V_{DD}$, thus avoiding an erroneous test in a real-speed scan test. Concretely, the sum $(N_1+N_2)$ of $N_1$ and $N_2$ and the absolute value $(|N_1-N_2|)$ of the difference between $N_1$ and $N_2$ are both made small, so that the IR drops at the capture pulse $C_1$ and the capture pulse $C_2$ are made small in a balanced manner, thus effectively avoiding an erroneous test in a real-speed scan test.

FIG. 2 is a flowchart showing a test vector generating program realizing the principle of the test vector generation of FIG. 1.

The routine of FIG. 2 is started by allocating an initial test cube obtained by an APTG program or an X-bit extracting program. In this case, the initial test cube is generated for detecting a target fault called an initial fault where the number of X-bits is defined by $N_{X1}$. Assume that the number of X-bits used for detecting other target faults called secondary faults is $N_{X2}$, an X-bit usage rate $X_{usage}$ for detection of the secondary fault is defined by $$X_{usage}=(N_{X2}/N_{X1})\times 100\% \qquad (1)$$

At step 201, the X-bit usage rate $X_{usage}$ is initialized at 0.

Next, at step 202, the X-bit usage rate $X_{usage}$ is compared with a preset upper limit $X_{th}$ such as 20% of the X-bit usage rate $X_{usage}$, i.e., it is determined whether or not $X_{usage} < X_{th}$. As a result, if $X_{usage} < X_{th}$, the control proceeds to step 203, while, if $X_{usage} \leq X_{th}$, the control proceeds to step 206.

Next, at step 203, it is determined whether or not other secondary faults are expected to be detected by the test cube. As a result, if expected, the control proceeds to step 204, while, if not expected, the control proceeds to step 206.

Next, at step 204, a required 0 or 1 is filled in an don't-care bit.

Next, at step 205, the X-bit usage rate $X_{usage}$ is renewed by using formula (I).

Processings at steps 202 to 205 are repeated until $X_{usage} \geq X_{th}$ is satisfied or detection of secondary faults is not expected, and then, the control proceeds to step 206.

At step 206, a filling process of a double-capture low power consumption is performed upon the test cube including the remainder X-bits. A detailed flow of step 206 is illustrated in FIG. 3.

At step 301, the X-type of each bit permutation ($ppi_1$, $ppo_1$, $ppo_2$) is determined. Here, $ppi_1$ designates a bit of the pseudo external input lines PPI of the combinational portion 11 of FIG. 1, $ppo_1$ designates a corresponding bit of the pseudo external output lines $PPO_1$ of the combinational portion $11_1$ of FIG. 1, and $ppo_2$ designates a corresponding bit of the pseudo external output lines $PPO_2$ of the combinational portion $11_2$ of FIG. 1.

As illustrated in FIG. 4, there are X-types 1 to 8 as the X-type of the above-mentioned bit permutation. Here, the X-type 1 has no X-bit, each of the X-types 2 to 4 has one X-bit, each of the X-types 5 to 7 has two X-bits, and the X-type 8 has three X-bits.

At step 302, it is determined whether or not all the bit permutations represent only X-type 1. If only X-type 1 is represented, the control proceeds to steps 308 and 309. On the other hand, if there is a bit permutation X-type 1, the control proceeds to step 303.

At step 303, total capture state transition numbers $TECTA_1$ and $TECTA_2$ for the target capture clock pulses $C_1$ and $C_2$, respectively are calculated, i.e., $$TECTA_1 = ECT_1 + PCT_1 \cdot k$$

where $ECT_1$ (Existing Capture Transition) is the number of bit pairs where the logic value of a bit of the pseudo external input lines $PPI_1$ of the first combinational portion $11_1$ is different from the logic value of its corresponding bit of the pseudo external output lines $PPO_1$ of the first combinational portion $11_1$, $PCT_1$ (Potential Capture Transition) is the number of bit pairs where at least one of a bit of the pseudo external input lines $PPI_1$ of the first combinational portion and its corresponding bit of the pseudo external output lines $PPO_1$ of the first combinational portion $11_1$ is an don't-care value, and k is a weight coefficient. For example, the value of k can be 0.5.

Also, $$TECTA_2 = ECT_2 + PCT_2 \cdot k$$

where $ECT_2$ (Existing Capture Transition) is the number of bit pairs where the logic value of a bit of the pseudo external input lines $PPO_1$ of the second combinational portion $11_2$ is different from the logic value of its corresponding bit of the pseudo external output lines $PPO_2$ of the second combinational portion $11_2$, $PCT_2$ (Potential Capture Transition) is the number of bit pairs where at least one of a bit of the pseudo external input lines $PPO_1$ of the second combinational portion $11_2$ and its corresponding bit of the pseudo external output lines $PPO_2$ of the second combinational portion $11_2$ is an don't-care value, and k is a weight coefficient. For example, the value of k can be 0.5.

FIG. 5 is a diagram illustrating calculation examples of the total capture state transition numbers $TECTA_1$ and $TECTA_2$. In the example of FIG. 5, $TECTA_1 = 2.5$ and $TECTA_2 = 2.0$, so that $TECTA_1 > TECTA_2$.

At step 304, the total capture state transition numbers $TECTA_1$ and $TECTA_2$ are compared with each other. As a result, if $TECTA_1 > TECTA_2$, the control proceeds to step 305, while, if $TECTA_1 \leq TECTA_2$, the control proceeds to step 306. Note that, step 304 can determine $TECTA_1 \geq TECTA_2$.

Step 305 performs a first X-filling processing. Also, step 306 performs a second X-filling processing.

Steps 303 to 306 balancedly perform a low power consumption filling processing for the target capture clock pulses $C_1$ and $C_2$.

At step 307, a logic simulation is performed, so that some or all of the X-bits existing in the external output lines PO and the pseudo external output lines PPO have logic values. After that, the control returns to step 301.

At step 308, the number of output-transited scan flip-flops cannot be reduced; however, a test cube always has X-bits in the external input lines PI. Therefore, in order to decrease the number of test vectors and the shift power consumption, a third X-filling-processing is performed to fill 0 or 1 in all the X-bits of the external input lines PI. As a result, at step 309, a test vector without X-bits can be obtained.

The first X-filling processing at step 305 of FIG. 3 is explained in detail with reference to FIG. 6.

First, at step 601, it is determined whether or not there are bit permutations of an assigning X-type. Here, the assigning X-type for the target capture clock pulse $C_1$ is formed by X-types 2 and 6. If there is at least one bit permutation of an assigning X-type, the control proceeds to step 602, while if there is no bit permutation of an assigning X-type, the control proceeds to step 603.

At step 602, one or a plurality of bit permutations of an assigning X-type are selected, logic values of corresponding bits of the pseudo external output lines PPO are assigned to X-bits $ppi_1$ of said bit permutations. For example, as illustrated in FIG. 7, logic value 1 of a corresponding bit b4 of the pseudo external output lines $PPO_1$ is assigned to X-bit a5 of the pseudo external input lines $PPI_1$. The assigning operation always succeeds. Therefore, the output of the scan flip-flop corresponding to the bit a5 and the bit 4 is not changed by a capture operation. As a result, the capture power consumption is decreased. Then, the control proceeds to step 307.

At step 603, a justifying easiness (JE) for each bit permutation of X-types 3, 5, 7 and 8 is calculated. Then, one bit permutation having the maximum justifying easiness JE is deemed to have a high success rate of justifying operation, and is selected as a target bit permutation.

The justifying easiness JE is defined as illustrated in (A) of FIG. 8. Here, S designates a signal line having an X-bit where a target logic value is required to be justified. Also, $S_1$, $S_2$, ..., $S_m$ are external input lines $PI_1$ of the combinational portions $11_1$ and $11_2$ of FIG. 1 and pseudo external input lines $PPI_1$ of the combinational portion $11_1$ which the signal line S can reach. The justifying easiness JE represents a mean reach easiness from S to $S_1$, $S_2$, ..., $S_m$. In (A) of FIG. 8, L is the maximum logic level of the entire circuit including the combinational portion $11_1$ of FIG. 1;

$L_S$ is a logic level of the signal line S; and $L_S$ is a logic level of the input line $S_j$. Note that the logic levels are defined in accordance with examples as illustrated in (B) of FIG. 8. That is, 1) The logic levels at the external output signal lines $PO_1$ of the combinational portion $11_1$ of FIG. 1, the external output signal lines $PO_2$ of the combinational portion $11_2$ of FIG. 2 and the pseudo external output signal lines $PPO_2$ of the combinational portion $11_2$ of FIG. 1 are made 1.
2) If the logic level at the output of a gate is $L_g$, the logic level at the input of the gate is $L_g+b$ 1.
3) If the logic levels of the fan-out signal lines of a gate are $L_1, L_2, \ldots, L_p$, the logic level at the output of the gate (the step of fan-outs) is the maximum value of $L_1, L_2, \ldots, L_p$.

For example, the justifying easiness JE (801) of a signal line 801 in (B) of FIG. 8 is $$JE(801) = (4 - |1-3|)/4 + (4 - |1-4|)/4$$
$$= 2/4 + 1/4$$
$$= 0.75$$

Also, the justifying easiness JE (802) of a signal line 802 in (B) of FIG. 8 is $$JE(802) = (4 - |1-4|)/4$$
$$= 1/4$$
$$= 0.25$$

Therefore, the greater the number of reachable X-bits to a signal line in a test cube, the larger the justifying easiness JE of the signal line, and also, the larger the difference in logic level therebetween, the larger the justifying easiness JE of the signal line.

At step 604, it is determined whether the selected target bit permutation is a justifying type (X-types 3, 5) which requires only a justifying operation or an assigning/justifying type (X-types 7 and 8) which requires both an assigning operation and a justifying operation. If a justifying type is selected, the control proceeds to steps 605 to 607, while if an assigning/justifying type is selected, the control proceeds to steps 608 to 614.

Steps 605 to 607 are explained next.

Step 605 performs a first justifying operation. That is, as illustrated in (A) of FIG. 9, a necessary logic value is decided in an X-bit within the test cube so that a logic value (in this example, 0) of the first bit (in this example, a4) of the target bit permutation of X-type 3 or 5 may appear in the second bit (in this example, b3) of the target bit permutation. Then, the control proceeds to step 606.

Step 606 determines whether or not the first justifying operation has failed. That is, when the necessary logic value cannot be decided and the operation fails, the control proceeds from step 606 to step 607 which performs a second justifying operation. That is, as illustrated in (B) of FIG. 9, a necessary logic value is decided in an X-bit within the test cube so that an opposite logic value (in this example, 1) to the logic value (in this example, 0) of the first bit (in this example, a4) of the target bit permutation of X-type 3 or 5 may appear in the second bit (in this example, b3) of the target bit permutation.

When it is determined that the first justifying operation has succeeded at step 606 or when the second justifying operation has completed at step 607, the control proceeds to step 307 of FIG. 3.

Steps 608 to 614 are explained next.

Step 608 performs a first assigning/justifying operation. That is, as illustrated in (A) of FIG. 10, a logic value 0 is assigned to the first bit (in this example, a6) of the target bit permutation of X-type 7 or 8, and a necessary logic value is decided in an X-bit within the test cube so that the logic value 0 may appear in the second bit (in this example, b5) of the target bit permutation. Then, at step 606, it is determined whether or not the first assigning/justifying operation has failed. If the operation has failed, the control proceeds from step 609 to step 610.

Step 610 performs a second assigning/justifying operation. That is, as illustrated in (B) of FIG. 10, a logic value 1 is assigned to the first bit (in this example, a6) of the target bit permutation of X-type 7 or 8, and a necessary logic value is decided in an X-bit within the test cube so that the logic value 1 may appear in the second bit (in this example, b5) of the target bit permutation. Then, at step 611, it is determined whether or not the second assigning/justifying operation has failed. If the operation has failed, the control proceeds from step 611 to step 612.

Step 612 performs a third assigning/justifying operation. That is, as illustrated in (A) of FIG. 11, a logic value 0 is assigned to the first bit (in this example, a6) of the target bit permutation of X-type 7 or 8, and a necessary logic value is decided in an X-bit within the test cube so that a logic value 1 may appear in the second bit (in this example, b5) of the target bit permutation. Then, at step 613, it is determined whether or not the third assigning/justifying operation has failed. If the operation has failed, the control proceeds from step 613 to step 614.

Step 614 performs a fourth assigning/justifying operation. That is, as illustrated in (B) of FIG. 11, a logic value 1 is assigned to the first bit (in this example, a6) of the target bit permutation of X-type 7 or 8, and a necessary logic value is decided in an X-bit within the test cube so that the logic value 0 may appear in the second bit (in this example, b5) of the target bit permutation.

When it is determined at step 609, 611 or 613 that the first, second or third assigning/justifying operation has succeeded or when the fourth assigning/justifying operation has completed at step 614, the control proceeds to step 307 of FIG. 3.

The second X-filling processing of step 306 of FIG. 3 is explained in detail with reference to FIG. 12.

At step 1201, a justifying easiness (JE) for each bit permutation of X-types 3 to 8 is calculated. Then, one bit permutation having the maximum justifying easiness JE is deemed to have a high success rate of justifying operation, and is selected as a target bit permutation.

At step 1202, it is determined whether the selected bit permutation is a single-justifying type (X-types 3, 4, 6 and 7) requiring one justifying operation for one X-bit or a double-justifying type (X-types 5 and 8) requiring two justifying operations for one X-bit. As a result, if a single-justifying type is selected, the control proceeds to steps 1203 to 1205, while, if a double-justifying type is selected, the control proceeds to steps 1206 to 1212.

Steps 1203 to 1205 are explained next.

Step 1203 performs a third justifying operation. That is, a necessary logic value is decided in an don't-care bit within the test cube so that the logic value of the second bit of the target bit permutation may appear in the third bit of the target bit permutation in the case where the selected bit sequence is X-type 4 or 6, and so that the logic value of the third bit of the target bit permutation may appear in the second bit of the target bit permutation in the case where the selected bit sequence is X-type 3 or 7. At step 1204, it is determined whether or not the third justifying operation has failed. If the operation has failed, the control proceeds from step 1204 to step 1205.

Step 1205 performs a fourth justifying operation. That is, a necessary logic value is decided in an don't-care bit within the test cube so that an opposite logic value to the logic value of the second bit of the target bit permutation may appear in the third bit of the target bit permutation in the case where the selected bit sequence is X-type 4 or 6, and so that an opposite logic value to the logic value of the third bit of the target bit permutation may appear in the second bit of the target bit permutation in the case where the selected bit sequence is X-type 3 or 7.

When it is determined that the third justifying operation has succeeded at step 1204 or when the fourth justifying operation has completed at step 1205, the control proceeds to step 307 of FIG. 3.

Steps 1206 to 1212 are explained next.

Step 1206 performs a fifth justifying operation. That is, a necessary logic value is decided in an X-bit within the test cube so that logic value 0 may appear in the second and third bits of the target bit permutation of X-type 5 or 8. At step 1207, it is determined whether or not the fifth justifying operation has failed. As a result, if the operation has failed, the control proceeds from step 1207 to 1208.

Step 1208 performs a sixth justifying operation. That is, a necessary logic value is decided in an X-bit within the test cube so that logic value 1 may appear in the second and third bits of the target bit permutation of X-type 5 or 8. At step 1209, it is determined whether or not the fifth sixth justifying operation has failed. As a result, if the operation has failed, the control proceeds from step 1209 to 1210.

Step 1210 performs a seventh justifying operation. That is, a necessary logic value is decided in an X-bit within the test cube so that logic value 0 and 1 may appear in the second and third bits, respectively, of the target bit permutation of X-type 5 or 8. At step 1211, it is determined whether or not the fifth seventh justifying operation has failed. As a result, if the operation has failed, the control proceeds from step 1211 to 1212.

Step 1212 performs an eighth justifying operation. That is, a necessary logic value is decided in an X-bit within the test cube so that logic value 1 and 0 may appear in the second and third bits, respectively, of the target bit permutation of X-type 5 or 8.

When it is determined at step 1207, 1209 or 1211 that the fifth, sixth or seventh justifying operation has succeeded or when the eighth justifying operation has completed at step 614, the control proceeds to step 307 of FIG. 3.

FIG. 13 is a diagram illustrating an example of the double-capture low power consumption filling processing according to the present invention.

As illustrated in (A) of FIG. 13, <X, X, 1, 0, X, X> is given as a test cube, and <1, 0, 0>, <0, X, 1>, <X, 1, X> and <X, 0, 1> are present as three-bit permutations. In this case, the total capture state transition numbers $TECTA_1$ and $TECTA_2$ for the capture clock pulses $C_1$ and $C_2$ are 2.5 and 2.0, respectively, and therefore, $TECTA_1 \square TECTA_2$, so that the total capture state transition number $TECTA_1$ first needs to be decreased.

In (B) of FIG. 13, assigning operations are performed upon the bits a5 and a6 of the pseudo external input lines $PPI_1$ of the combinational portion $11_1$ for the target capture clock pulse $C_1$. Thus, the total capture state transition number $TECTA_1$ for the target capture clock pulse $C_1$ is decreased. In this case, the total capture state transition numbers $TECTA_1$ and $TECTA_2$ of the capture clock pulses $C_1$ and $C_2$ are 1.5 and 2.0, respectively, and therefore, $TECTA_1 < TECTA_2$, so that the total capture state transition number $TBCTA_2$ for the target capture clock pulse $C_2$ next needs to be decreased.

In (C) of FIG. 13, justifying operations are performed upon the bit d4 of the pseudo external input lines $PPO_2$ of the combinational portion $11_2$ for the target capture clock pulse $C_2$. Thus, the total capture state transition number $TECTA_2$ for the target capture clock pulse $C_2$ is decreased. In this case, the total capture state transition numbers $TECTA_1$ and $TECTA_2$ of the capture clock pulses $C_1$ and $C_2$ are 1.5 and 1.5, respectively, and therefore, $TECTA_1 \square TECTA_2$, so that the total capture state transition number $TECTA_1$ for the target capture clock pulse $C_1$ next needs to be decreased.

In (D) of FIG. 13, justifying operations are performed upon the pseudo external input bit b3 of the combinational portion $11_1$ for the target capture clock pulse $C_1$. Thus, the total capture state transition number $TECTA_1$ for the target capture clock pulse $C_1$ is decreased.

Thus, the power consumption for the target capture clock pulses $C_1$ and $C_2$ can be decreased in a balanced manner.

Note that, at steps 605 and 607 of FIG. 6, the sequence of the logic value of the justifying operations is 0→1; however, this sequence can be 1→0. Also, at steps 608 and 610 of FIG. 6, the sequence of the logic value of the assigning/justifying operations is (0 assignment, 0 justification)→(1 assignment, 1 justification); however, this sequence can be (1 assignment, 1 justification)→(0 assignment, 0 justification). Further, at steps 612 and 614 of FIG. 6, the sequence of the logic value of the assigning/justifying operations is (0 assignment, 1 justification)→(1 assignment, 0 justification); however, this sequence can be (1 assignment, 0 justification)→(0 assignment, 1 justification).

Note that, at steps 1203 and 1205 of FIG. 12, the sequence of the logic value of the third and fourth justifying operations is 0→1; however, this sequence can be 1→0. Also, at steps 1206 and 1208 of FIG. 12, the sequence of the logic value of the justifying operations is (0 justification, 0 justification)→(1 justification, 1 justification); however, this sequence can be (1 justification, 1 justification)→(0 justification, 0 justification). Further, at steps 1210 and 1212 of FIG. 12, the sequence of the logic value of the justifying operations is (0 justification, 1 justification)→(1 justification, 0 justification); however, this sequence can be (1 justification, 0 justification)→(0 justification, 1 justification).

The above-described routines of FIGS. 2, 3, 6 and 12 are stored in a memory medium as programs. For example, if the memory medium is a non-volatile memory such as a ROM, the program is incorporated thereinto in advance, while, if the memory medium is a volatile memory such as a RAM, the program is written thereinto as occasion demands.

DESCRIPTION OF THE SYMBOLS

Figure 1:
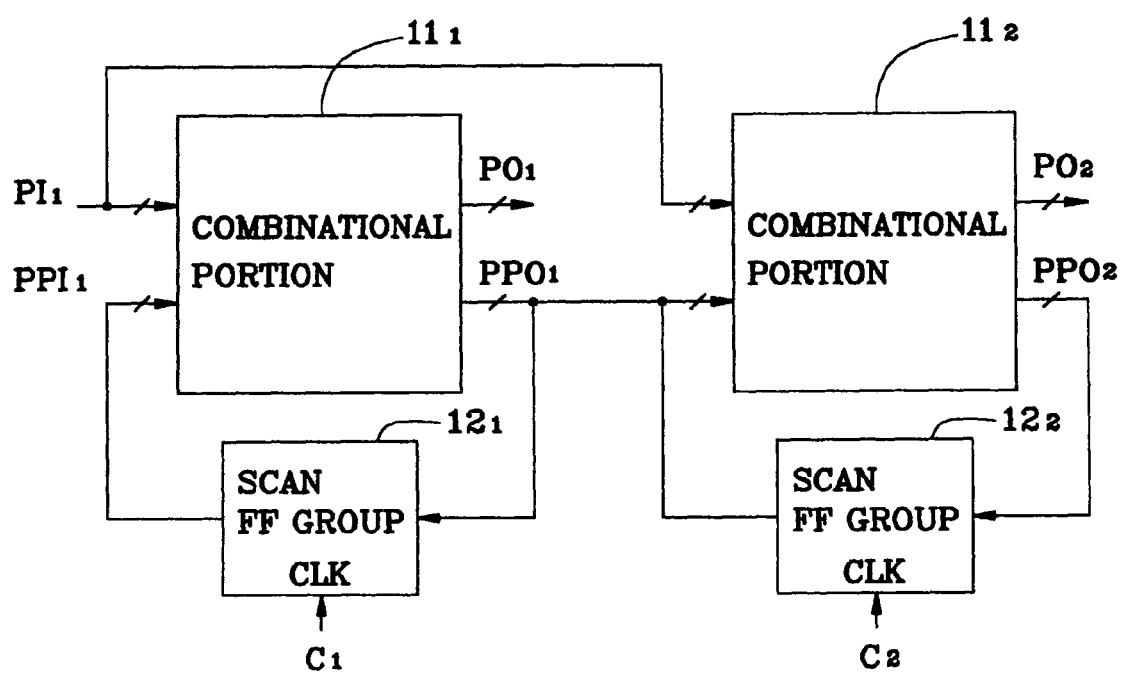
FIG. 1 A circuit expansion diagram illustrating the principle of a test vector generation of the semiconductor logic circuit device according to the present invention.
Figure 2:
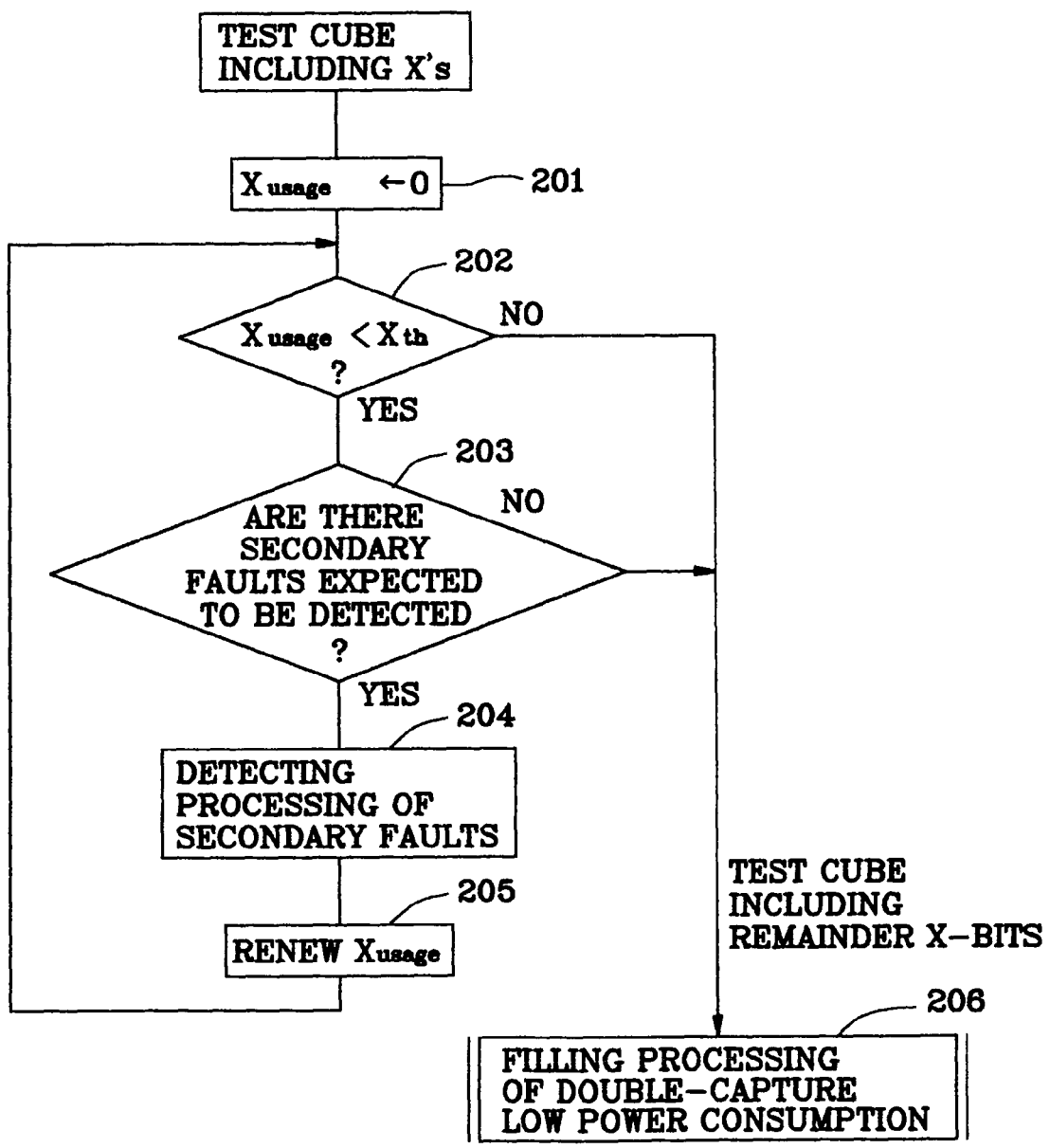
FIG. 2 A flowchart for explaining a carrying-out mode of the test vector generating method of a semiconductor logic circuit device according to the present invention.
Figure 3:
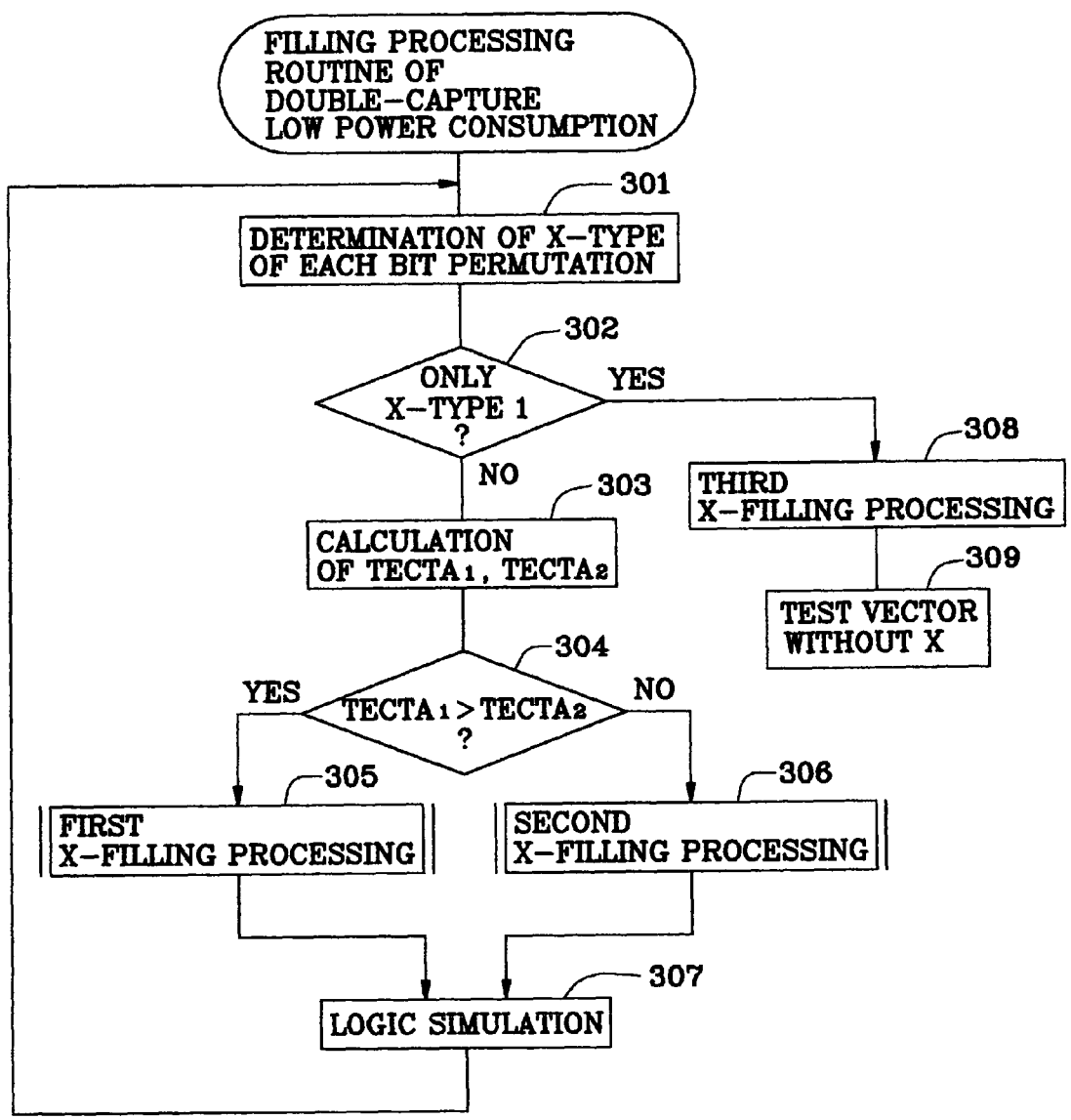
FIG. 3 A detailed flowchart of the double-capture low power consumption filling step of FIG. 2.
Figures 4, 5:
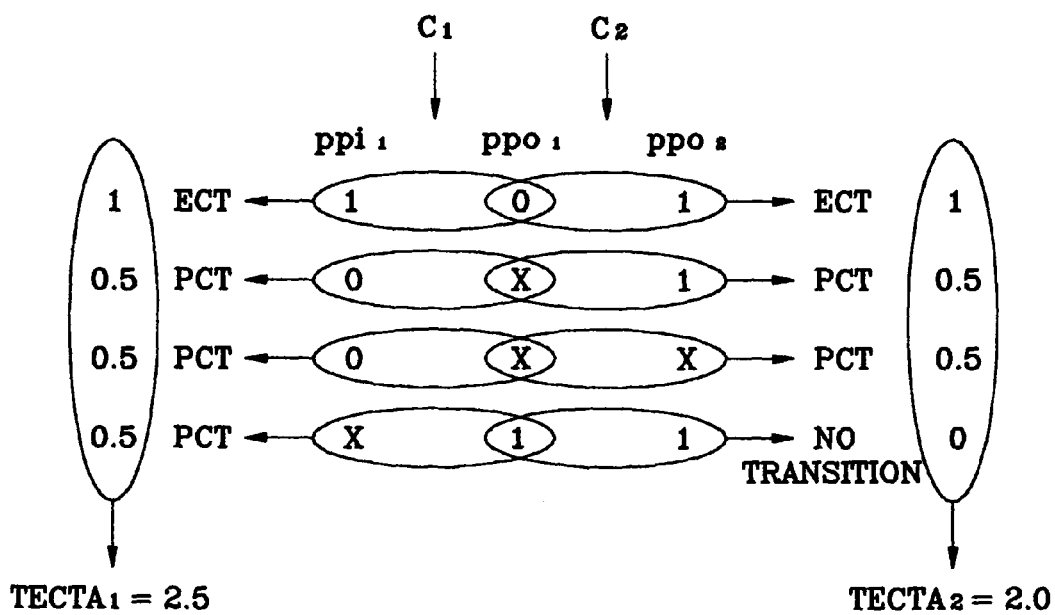
FIG. 4 A table illustrating X-types of step 301 of FIG. 3.
FIG. 5 A diagram illustrating an example of calculation of the total capture state transition numbers of step 303 of FIG. 3.
Figure 6:
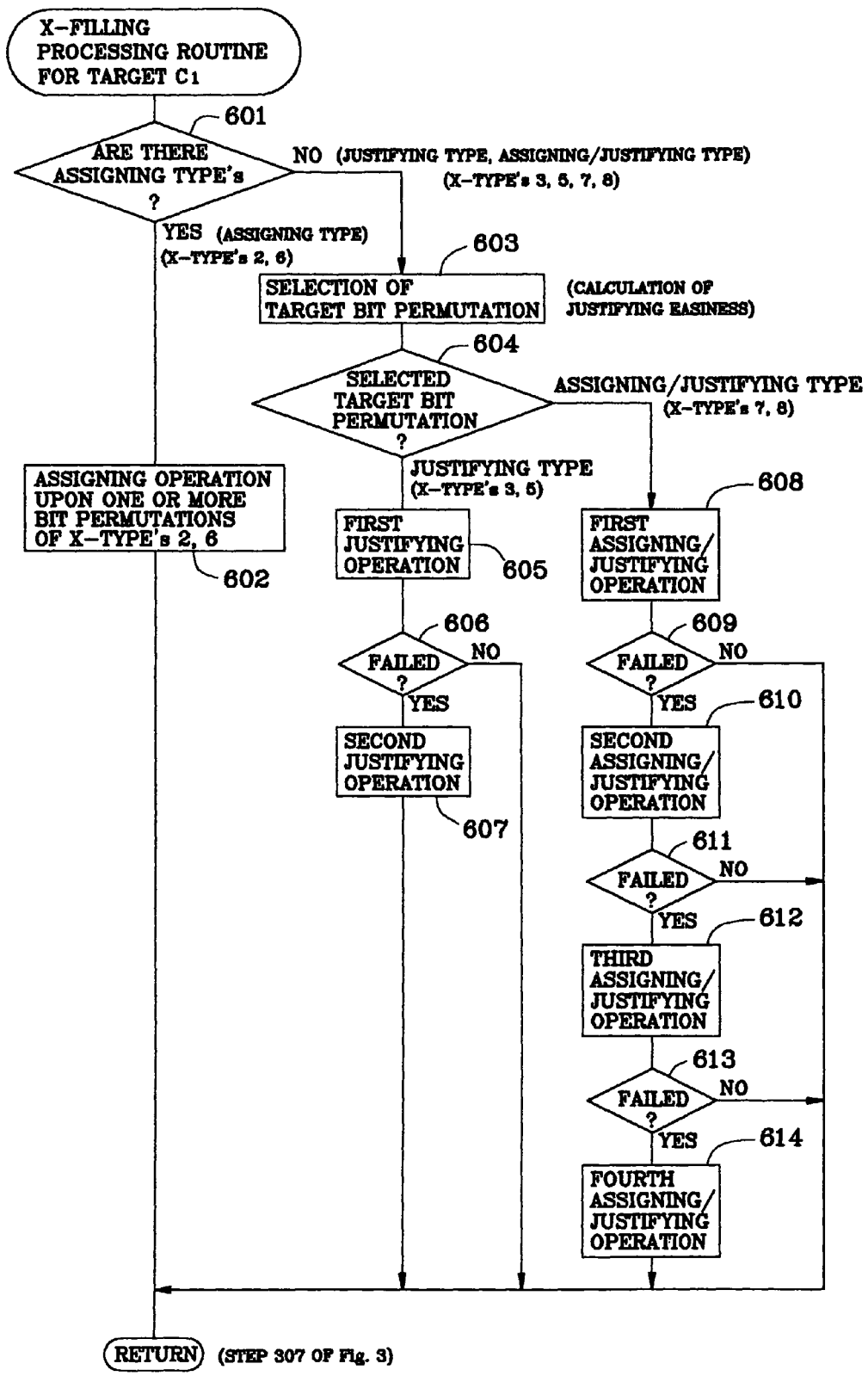
FIG. 6 A detailed flowchart of the X-filling processing step 305 for the target capture clock pulse $C_1$ of FIG. 3.
Figure 7:
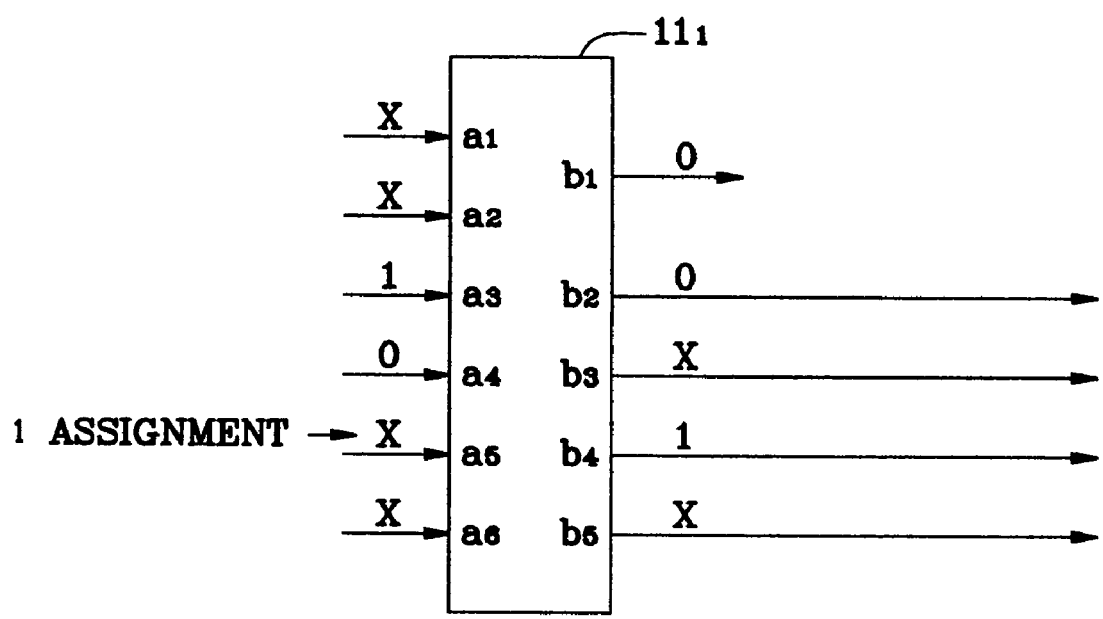
FIG. 7 A diagram for explaining step 602 of FIG. 6.
Figure 8:
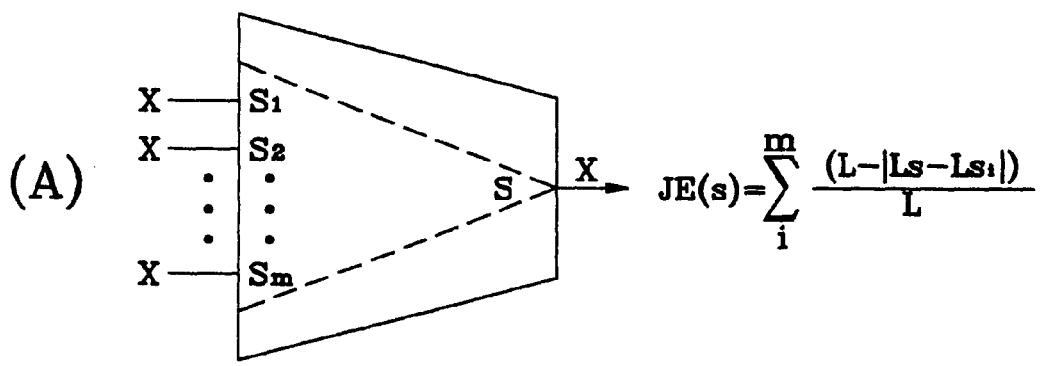
FIG. 8 A diagram for explaining the justifying easiness calculating step 603 of FIG. 6.
Figure 8:
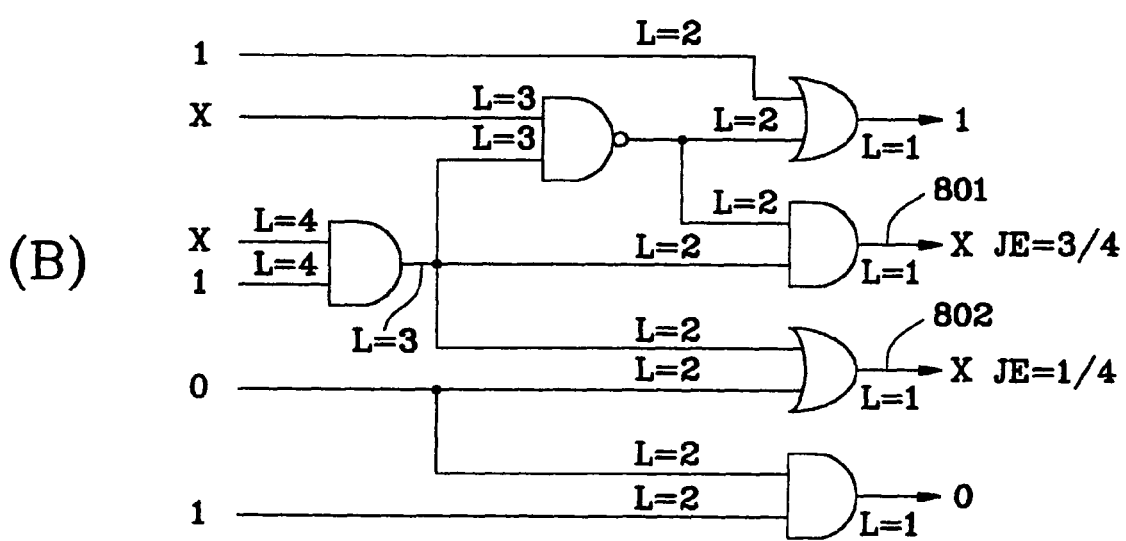
Figure 9:
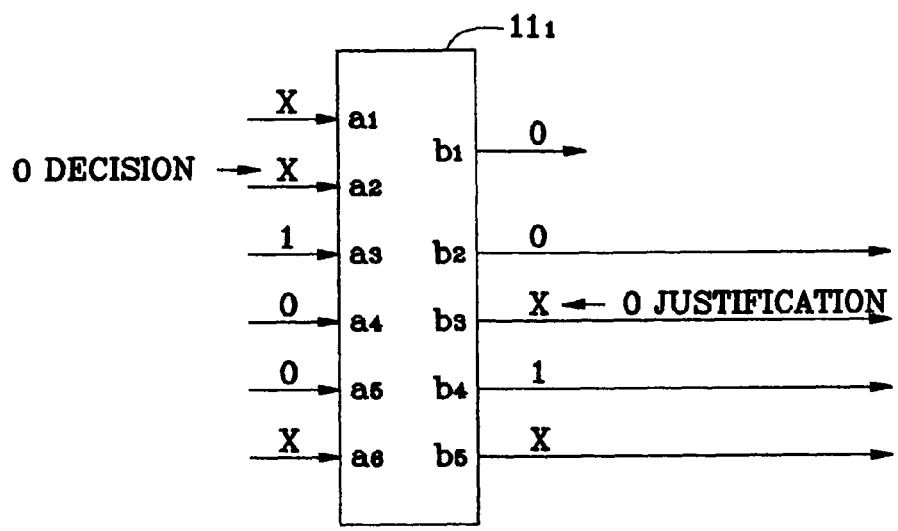
FIG. 9 A diagram for explaining the justifying operation steps 605 and 607 of FIG. 6.
Figure 9:
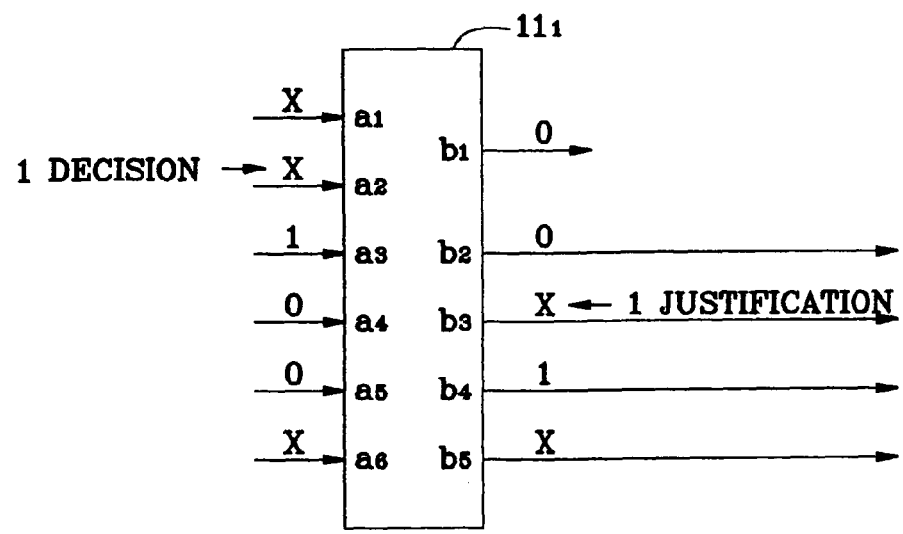
Figure 10:
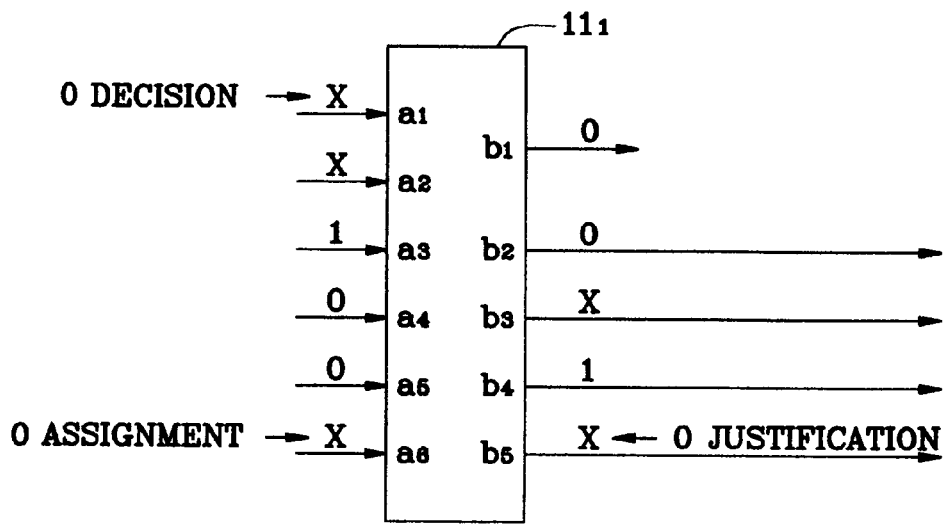
FIG. 10 A diagram for explaining the assigning/justifying operation steps 608 and 610 of FIG. 6.
Figure 10:
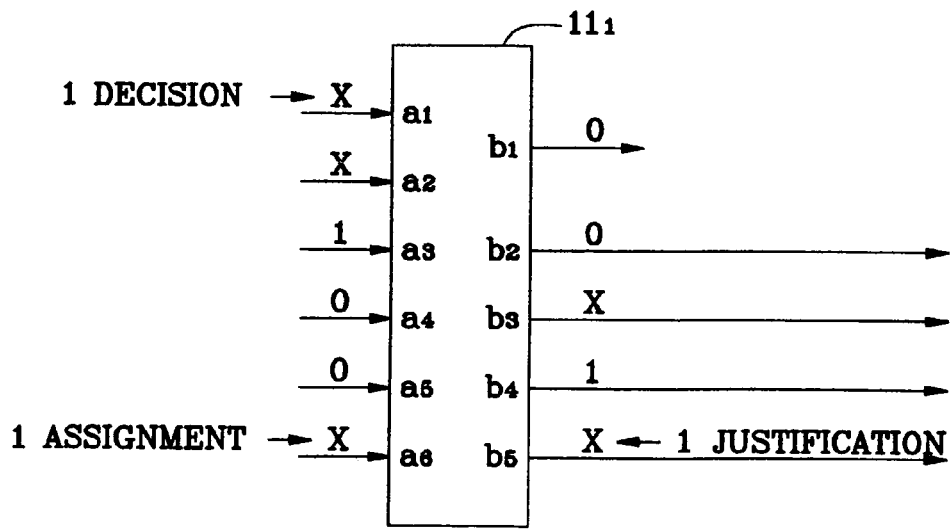
Figure 11:
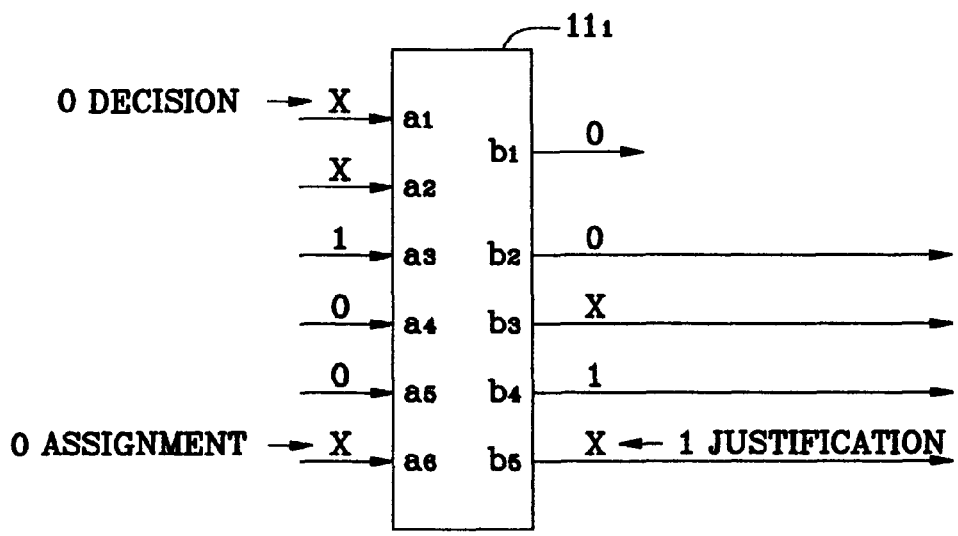
FIG. 11 A diagram for explaining the assigning/justifying operation steps 612 and 614 of FIG. 6.
Figure 11:
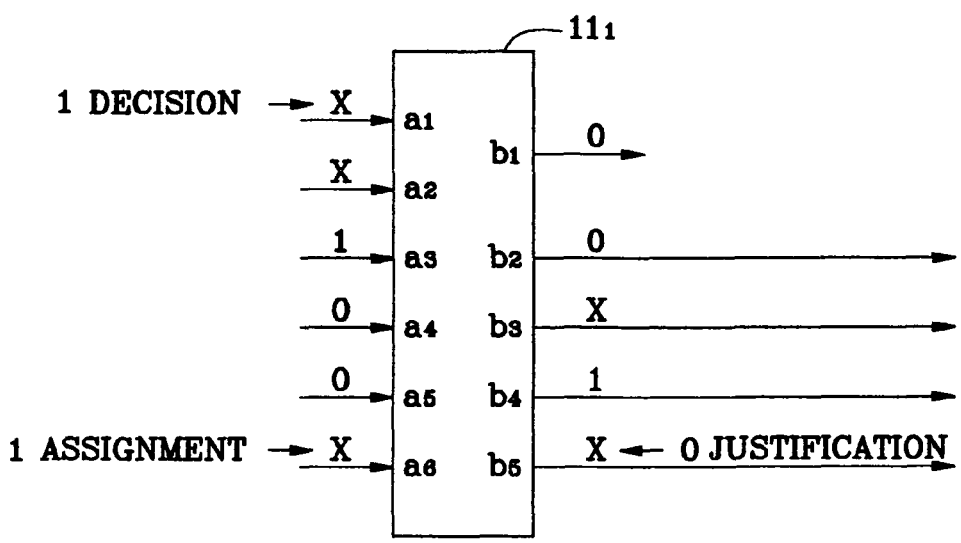
Figure 12:
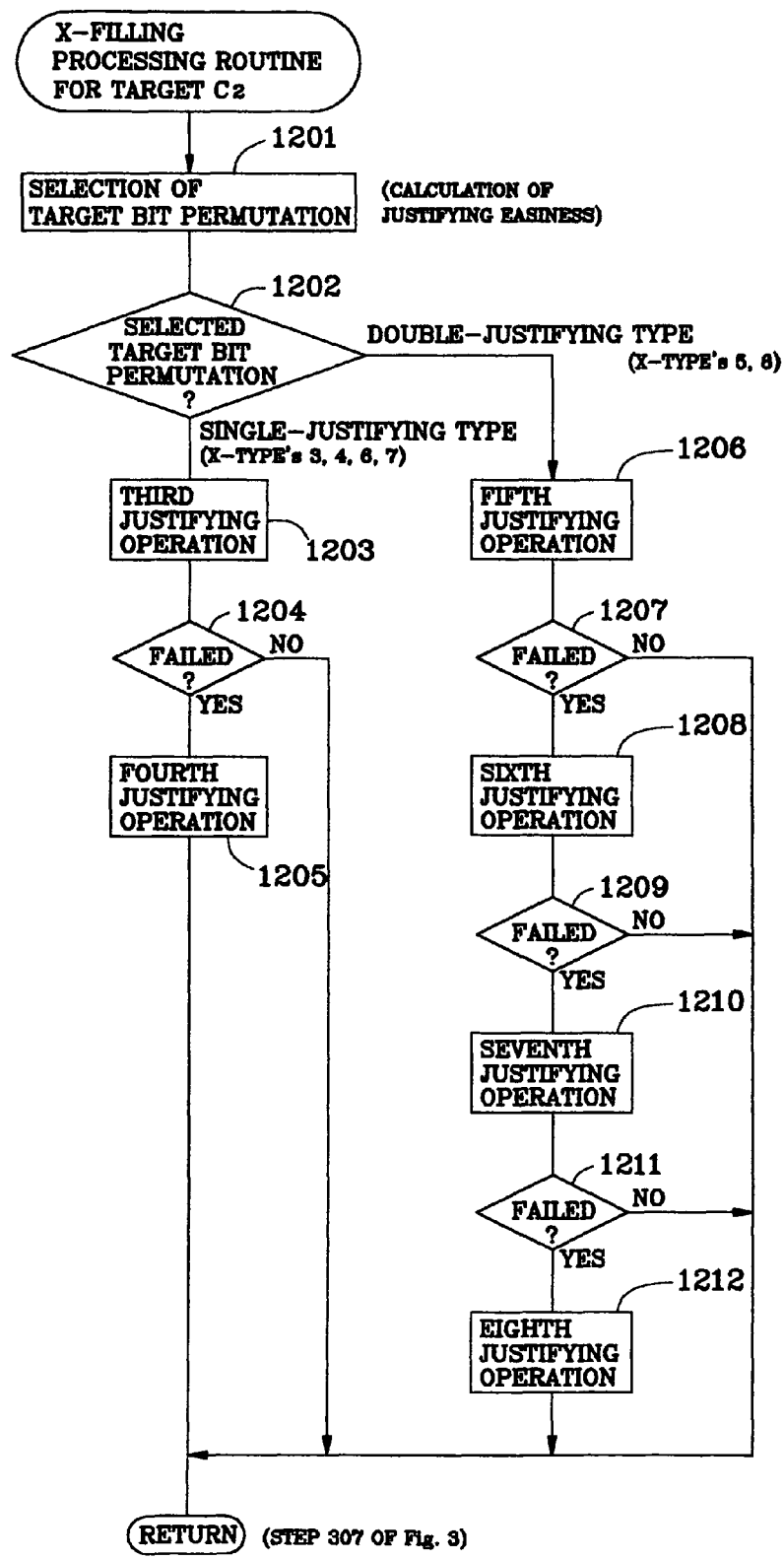
FIG. 12 A detailed flowchart of the X-filling processing step 306 for the target capture clock pulse $C_2$ of FIG. 3.
Figure 13:
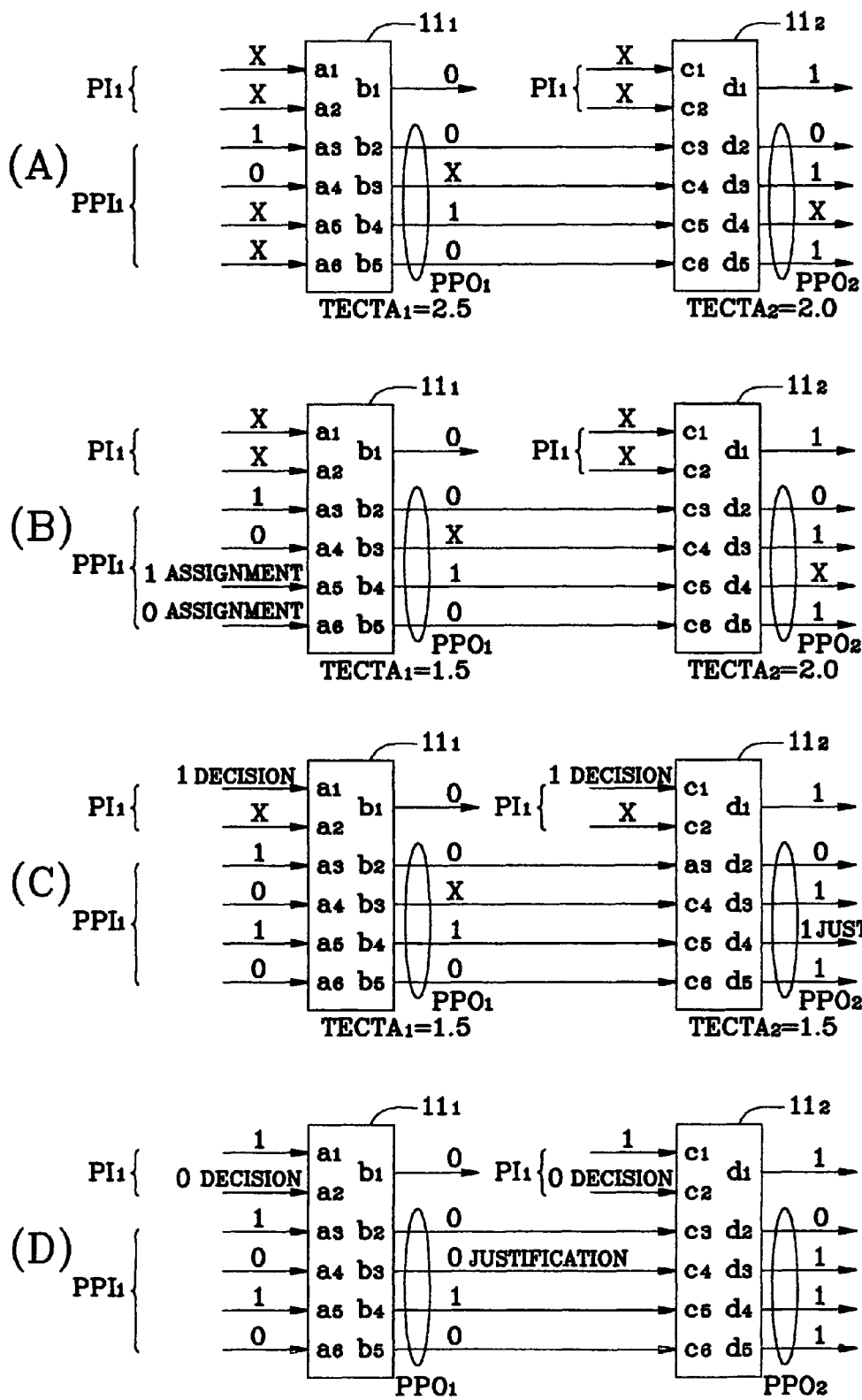
FIG. 13 A diagram illustrating an example of the double-capture low power consumption filling processing according to the present invention.
Figure 14:
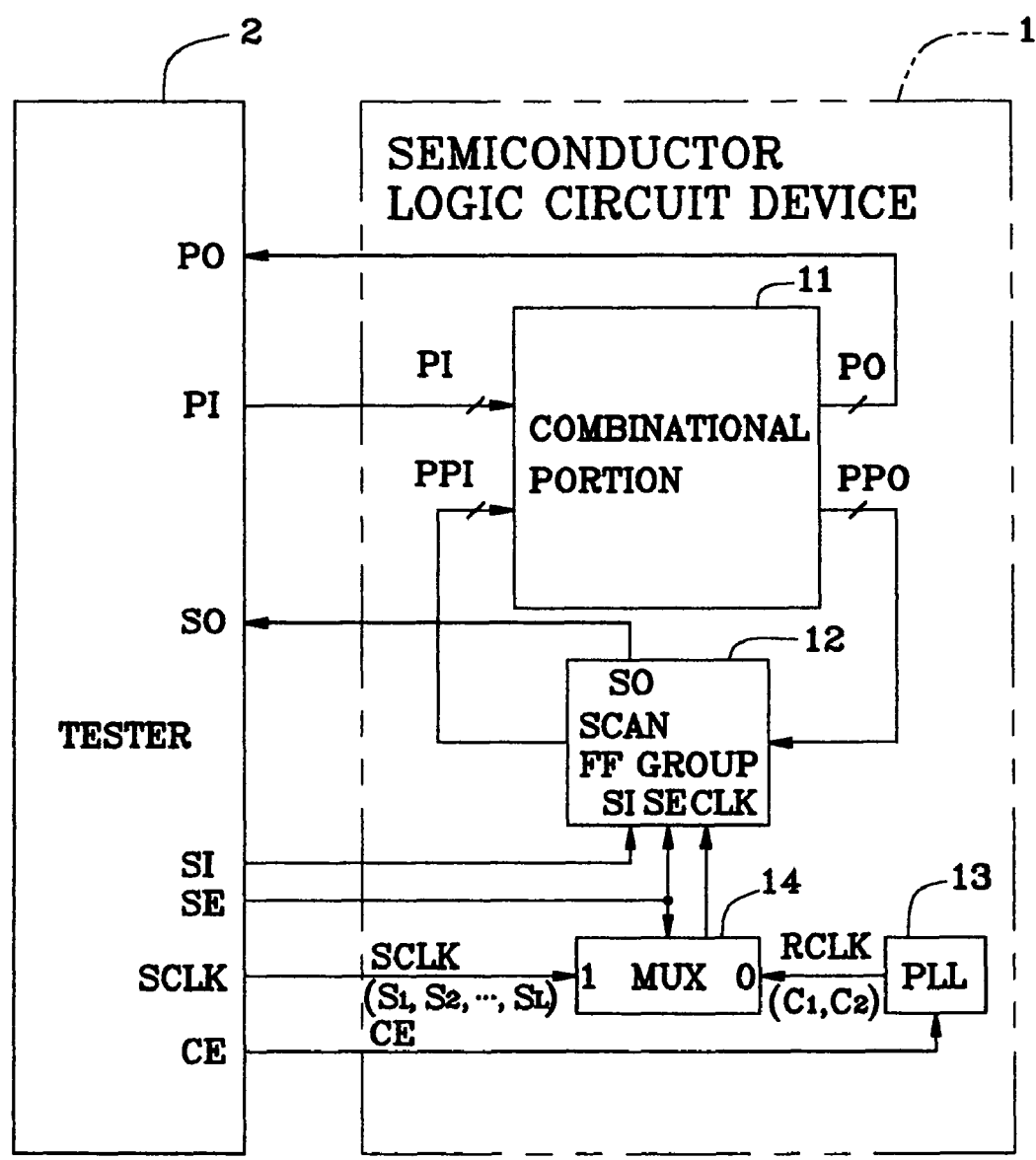
FIG. 14 A block circuit diagram for explaining a prior art real-speed scan test.
Figure 15:
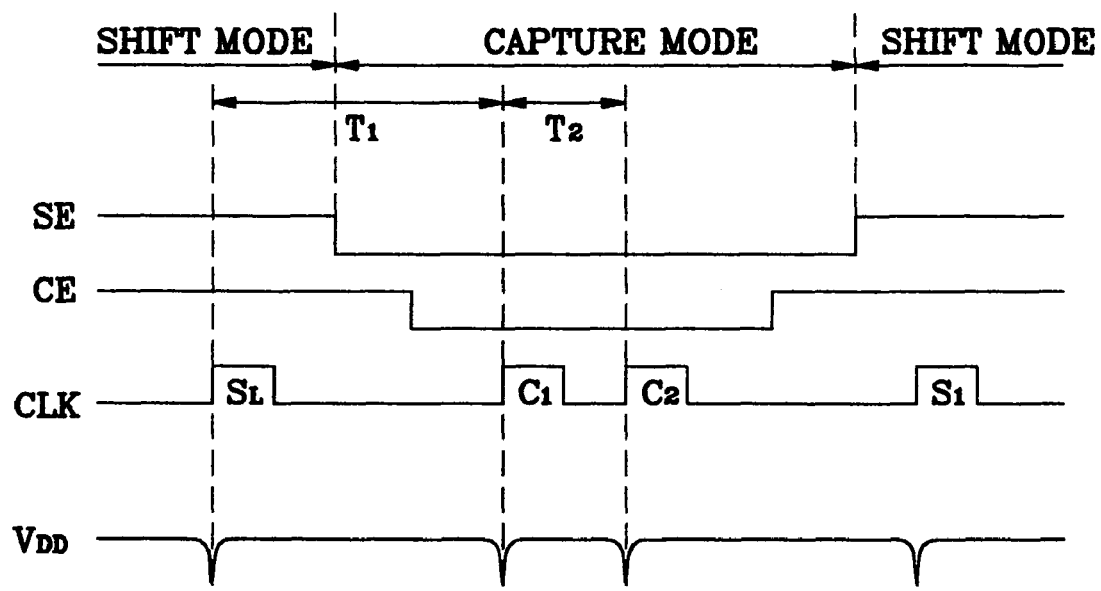
FIG. 15 A timing diagram for explaining the circuit operation of FIG. 14.

11, $11_1$, $11_2$: combinational portions
12: scan flip-flop group
PI: external input lines
PPI: pseudo external input lines
PO: external output lines
PPO: pseudo external output lines
SC: scan chain

The invention claimed is:

1. A test vector generating method of a semiconductor logic circuit device comprising:
   a combinational portion (11) having external input lines (PI), pseudo external input lines (PPI), external output lines (PO) and pseudo external output lines (PPO); and
   a scan flip-flop group (12) connected between said pseudo external output lines and said pseudo external input lines,
   characterized in that said combinational portion is hypothetically formed by first and second combinational portions ($11_1$, $11_2$) having said external input lines in common, said scan flip-flop group being hypothetically formed by first and second scan flip-flop groups ($12_1$, $12_2$) operated by first and second capture clock pulses ($C_1$, $C_2$) continuously performed upon said first and second combinational portions,
   said test vector generating method comprising:
   a first filling step adapted to fill 0 or 1 in don't-care bits of a test cube so that the same logic value may appear in a bit of the pseudo external input lines and a respective bit of the pseudo external output lines of said first combinational portion, when a test cube including don't-care bits not used for detecting faults is given to the external input lines and the pseudo external input lines of said first combinational portion and there is an don't-care bit in said bit of the pseudo external input lines of said first combinational portion or said respective bit of the pseudo external output lines of said first combinational portion;
   a second filling step adapted to fill 0 or 1 in don't-care bits of a test cube so that the same logic value may appear in a bit of the pseudo external input lines and a respective bit of the pseudo external output lines of said second combinational portion, when a test cube including don't-care bits not used for detecting faults is given to the external input lines and the pseudo external input lines of said first combinational portion and there is an don't-care bit in said bit of the pseudo external input lines of said second combinational portion or said respective bit of the pseudo external output lines of said second combinational portion;
   a balancedly discrepancy decreasing step adapted to select said first and second filling steps and repeatedly operate the selected filling step so that the number of discrepancies between bits of the pseudo external input lines of said first combinational portion and respective bits of the pseudo external output lines of said first combinational portion and the number of discrepancies between bits of the pseudo external input lines of said second combinational portion and respective bits of the pseudo external output lines of said second combinational portion are decreased in a balanced manner; and
   a third filling step adapted to fill 0 or 1 in all specified bits of the external input lines of said first combinational portion, when there is no don't-care bit in the pseudo external input lines of said first combinational portion, the pseudo external output lines of said first combinational portion and the pseudo external output lines of said second combinational portion,
   thereby converting said test cube into a test vector having no don't-care bits.

2. The test vector generating method of a semiconductor logic circuit device as set forth in claim 1, wherein said balancedly discrepancy decreasing step comprises:
   an X-type determining step adapted to determine an X-type of a 3-bit permutation formed by a bit ($ppi_1$) of the pseudo external input lines of said first combinational portion, a respective bit ($ppo_1$) of the pseudo external output lines of said first combinational portion and a respective bit ($ppo_2$) of the pseudo external output lines of said second combinational portion;
   first and second total capture state transition number calculating steps adapted to calculate first and second total capture state transition numbers ($TECTA_1$, $TECTA_2$) of said first and second scan flip-flop groups by said first and second capture clock pulses; and
   a logic simulating step adapted to perform a logic simulation every time after said first or second filling step is performed, so that some or all of don't-care bits of the external output lines and the pseudo external output lines of said first and second combinational portions are decided to be 0 or 1,
   said first filling step being performed when said first total capture state transition number is larger than said second total capture state transition number, said second filling step being performed when said second total capture state transition number is larger than said first total capture state transition number, said first or second filling step being performed when said first total capture state transition number is equal to said second total capture state transition number,
   said X-type determining step, said first and second total capture state transition number calculating step, said first and second filling steps and said logic simulating step being repeated until there are no don't-care bits in the pseudo external output lines of said first combinational portion, the pseudo external output lines of said first combinational portion and the pseudo external output lines of said second combinational portion.

3. The test vector generating method of a semiconductor logic circuit device as set forth in claim 2, wherein said X-type determining step is adapted to determine the X-type of the three-bit permutation ($ppi_1$, $ppo_1$, $ppo_2$) formed by the bit ($ppi_1$) of the pseudo external input lines of said first combinational portion, the respective bit ($ppo_1$) of the pseudo external output lines of said first combinational portion and the respective bit ($ppo_2$) of the pseudo external output lines of said second combinational portion where X is defined by an don't-care bit and $b_1$, $b_2$ and $b_3$ are arbitrary logic values, so that the X-type of a bit permutation ($b_1$, $b_2$, $b_3$) is defined by X-type 1, the X-type of a bit permutation (X, $b_2$, $b_3$) is defined by X-type 2, the X-type of a bit permutation ($b_1$, X, $b_3$) is defined by X-type 3, the X-type of a bit permutation ($b_1$, $b_2$, X) is defined by X-type 4, the X-type of a bit permutation ($b_1$, X, X) is defined by X-type 5, the X-type of a bit permutation (X, $b_2$, X) is defined by X-type 6, the X-type of a bit permutation (X, X, $b_3$) is defined by X-type 7, and the X-type of a bit permutation (X, X, X) is defined by X-type 8.

4. The test vector generating method of a semiconductor logic circuit device as set forth in claim 2, wherein said first total capture state transition number calculating step calculates a first total capture state transition number $TECTA_1$ by $$TECTA_1 = ECT_1 + PCT_1 \cdot k$$

where $ECT_1$ is the number of bit pairs where the logic value of a bit of the pseudo external input lines of said first combinational portion is different from the logic value of a respective bit of the pseudo external output lines of said first combinational portion, $PCT_1$ is the number of bit pairs where at least one of a bit of the pseudo external input lines of said first combinational portion and a respective bit of the pseudo external output lines of said first combinational portion is an don't-care value, and k is a weight coefficient, and wherein said second total capture state transition number calculating step calculates a second total capture state transition number $TECTA_2$ by $$TECTA_2 = ECT_2 + PCT_2 \cdot k$$

where $ECT_2$ is the number of bit pairs where the logic value of a bit of the pseudo external input lines of said second combinational portion is different from the logic value of a respective bit of the pseudo external output lines of said second combinational portion, $PCT_2$ is the number of bit pairs where at least one of a bit of the pseudo external input lines of said second combinational portion and a respective bit of the pseudo external output lines of said second combinational portion is an don't-care value, and k is a weight coefficient.

5. The test vector generating method of a semiconductor logic circuit device as set forth in claim 2, wherein said first filling step comprises:

an assigning step adapted to select one or a plurality of bit permutations of X-type 2 or 6 as target bit permutations when there are bit permutations of X-type 2 or 6, and assign logic values of the second bits of said target bit permutations to the first bits of said target bit permutations;

a first justifying easiness calculating step adapted to calculate a first justifying easiness ($JE_1$) for each bit permutation of X-types 3, 5, 7 and 8 when there is no bit permutation of X-type 2 or 6;

a first target bit permutation selecting step adapted to select one of said bit permutations of X-types 3, 5, 7 or 8 having a maximum first justifying easiness ($JE_1$) as a target bit permutation when there is no bit permutation of X-type 2 or 6;

a first justifying operation step adapted to decide 0 or 1 in an don't-care bit of said test cube so that a logic value of the first bit of said target bit permutation may appear in the second bit of said target bit permutation, when said target bit permutation is X-type 3 or 5;

a second justifying operation step adapted to decide 0 or 1 in an don't-care bit of said test cube so that an opposite value of the logic value of the first bit of said target bit permutation may appear in the second bit of said target bit permutation, when said first justifying operation step has failed;

a first assigning/justifying operation step adapted to assign a first logic value to the first bit of said target bit permutation and decide 0 or 1 in an don't-care bit of said test cube so that said first logic value may appear in the second bit of said target bit permutation, when said target bit permutation is X-type 7 or 8;

a second assigning/justifying operation step adapted to assign a second logic value opposite to said first logic value to the first bit of said target bit permutation and decide 0 or 1 in an don't-care bit of said test cube so that said second logic value may appear in the second bit of said target bit permutation, when said first assigning/justifying operation step has failed;

a third assigning/justifying operation step adapted to assign one (logic value A) of first and second logic values to the first bit of said target bit permutation and decide 0 or 1 in an don't-care bit of said test cube so that the other (logic value B) of said first and second logic values may appear in the second bit of said target bit permutation, when said second assigning/justifying operation step has failed; and a fourth assigning/justifying operation step adapted to assign said logic value B to the first bit of said target bit permutation and decide 0 or 1 in an don't-care bit of said test cube so that said logic value B may appear in the second bit of said target bit permutation, when said third assigning/justifying operation step has failed.

6. The test vector generating method of a semiconductor logic circuit device as set forth in claim 5, wherein said first justifying easiness calculating step calculates said first justifying easiness in accordance with a mean distance from don't-care bits of said external input lines and said pseudo external input lines to the second bit of said each bit permutation of X-types 3, 5, 7 and 8.

7. The test vector generating method of a semiconductor logic circuit device as set forth in claim 2, wherein said second filling step comprises:

a second justifying easiness calculating step adapted to calculate a second justifying easiness ($JE_2$) for each bit permutation of X-types 3 to 8;

a second target bit permutation selecting step adapted to select one of said bit permutations of X-types 3 to 8 having a maximum second justifying easiness ($JE_2$) as a target bit permutation;

a third justifying operation step adapted to decide 0 or 1 in an don't-care bit of said test cube so that a logic value of the second bit of said target bit permutation may appear in the third bit of said target bit permutation, when said target bit permutation is X-type 4 or 6 and so that a logic value of the third bit of said target bit permutation may appear in the second bit of said target bit permutation, when said target bit permutation is X-type 3 or 7;

a fourth justifying operation step adapted to decide 0 or 1 in an don't-care bit of said test cube so that a logic value opposite to the logic value of the second bit of said target bit permutation may appear in the third bit of said target bit permutation, when said target bit permutation is X-type 4 or 6 and so that a logic value opposite to the logic value of the third bit of said target bit permutation may appear in the second bit of said target bit permutation, when said target bit permutation is X-type 3 or 7, when said third justifying operation step has failed;

a fifth justifying operation step adapted to decide 0 or 1 in an don't-care bit of said test cube so that a third logic value may appear in the second and third bits of said target bit permutation, when said target bit permutation is X-type 5 or 8;

a sixth justifying operation step adapted to decide 0 or 1 in an don't-care bit of said test cube so that a fourth logic value opposite to the said third logic value may appear in the second and third bits of said target bit permutation, when said fifth justifying operation step has failed;

a seventh justifying operation step adapted to decide 0 or 1 in an don't-care bit of said external input lines or said test cube so that one (logic value C) of said third and fourth logic values to the second bit of said target bit permutation and so that the other (logic value D) of said third and fourth logic values may appear in the third bit of said target bit permutation, when said sixth justifying operation step has failed; and an eighth justifying operation step adapted to decide 0 or 1 in an don't-care bit of said external input lines or said test cube so that assign said logic value D to the second bit of said target bit permutation and so that said logic value C may appear in the third bit of said target bit permutation, when said seventh justifying operation step has failed.

8. The test vector generating method of a semiconductor logic circuit device as set forth in claim 7, wherein said second justifying easiness calculating step calculates said second justifying easiness in accordance with a mean distance to don't-care bits of said external input lines and said pseudo external input lines from a set of don't-care bits except for the first bit of said each bit permutation of X-types 3 to 8.

9. A test vector generating program of a semiconductor logic circuit device comprising:

a combinational portion (11) having external input lines (PI), pseudo external input lines (PPI), external output lines (PO) and pseudo external output lines (PPO); and a scan flip-flop group (12) connected between said pseudo external output lines and said pseudo external input lines, characterized in that said combinational portion is hypothetically formed by first and second combinational portions ($11_1$, $11_2$) having said external input lines in common, said scan flip-flop group being hypothetically formed by first and second scan flip-flop groups ($12_1$, $12_2$) operated by first and second capture clock pulses ($C_1$, $C_2$) continuously performed upon said first and second combinational portions, said test vector generating program comprising:

a first filling processing adapted to fill 0 or 1 in don't-care bits of a test cube so that the same logic value may appear in a bit of the pseudo external input lines and a respective bit of the pseudo external output lines of said first combinational portion, when a test cube including don't-care bits not used for detecting faults is given to the external input lines and the pseudo external input lines of said first combinational portion and there is an don't-care bit in said bit of the pseudo external input lines of said first combinational portion or said respective bit of the pseudo external output lines of said first combinational portion;

a second filling processing adapted to fill 0 or 1 in don't-care bits of a test cube so that the same logic value may appear in a bit of the pseudo external input lines and a respective bit of the pseudo external output lines of said second combinational portion, when a test cube including don't-care bits not used for detecting faults is given to the external input lines and the pseudo external input lines of said first combinational portion and there is an don't-care bit in said bit of the pseudo external input lines of said second combinational portion or said respective bit of the pseudo external output lines of said second combinational portion;

a balancedly discrepancy decreasing processing adapted to select said first and second filling steps and repeatedly operate the selected filling step so that the number of discrepancies between bits of the pseudo external input lines of said first combinational portion and respective bits of the pseudo external output lines of said first combinational portion and the number of discrepancies between bits of the pseudo external input lines of said second combinational portion and respective bits of the pseudo external output lines of said second combinational portion are decreased in a balanced manner; and a third filling processing adapted to fill 0 or 1 in all specified bits of the external input lines of said first combinational portion, when there is no don't-care bit in the pseudo external input lines of said first combinational portion, the pseudo external output lines of said first combinational portion and the pseudo external output lines of said second combinational portion, thereby converting said test cube into a test vector having no don't-care bits.

10. The test vector generating program of a semiconductor logic circuit device as set forth in claim 9, wherein said balancedly discrepancy decreasing processing comprises:

an X-type determining processing adapted to determine an X-type of a 3-bit permutation formed by a bit ($ppi_1$) of the pseudo external input lines of said first combinational portion, a respective bit ($ppo_1$) of the pseudo external output lines of said first combinational portion and a respective bit ($ppo_2$) of the pseudo external output lines of said second combinational portion;

first and second total capture state transition number calculating processings adapted to calculate first and second total capture state transition numbers ($TECTA_1$, $TECTA_2$) of said first and second scan flip-flop groups by said first and second capture clock pulses; and a logic simulating processing adapted to perform a logic simulation every after said first or second filling step is performed, so that some or all of don't-care bits of the external output lines and the pseudo external output lines of said first and second combinational portions are decided to be 0 or 1, said first filling processing being performed when said first total capture state transition number is larger than said second total capture state transition number, said second filling processing being performed when said second total capture state transition number is larger than said first total capture state transition number, said first or second filling processing being performed when said first total capture state transition number is equal to said second total capture state transition number, said X-type determining processing, said first and second total capture state transition number calculating processing, said first and second filling processings and said logic simulating processing being repeated until there are no don't-care bits in the pseudo external output lines of said first combinational portion, the pseudo external output lines of said first combinational portion and the pseudo external output lines of said second combinational portion.

11. The test vector generating program of a semiconductor logic circuit device as set forth in claim 10, wherein said X-type determining processing is adapted to determine the X-type of the three-bit permutation ($ppi_1$, $ppo_1$, $ppo_2$) formed by the bit ($ppi_1$) of the pseudo external input lines of said first combinational portion, the respective bit ($ppo_1$) of the pseudo external output lines of said first combinational portion and the respective bit ($ppo_2$) of the pseudo external output lines of said second combinational portion where X is defined by an don't-care bit and $b_1$, $b_2$ and $b_3$ are arbitrary logic values, so that the X-type of a bit permutation ($b_1$, $b_2$, $b_3$) is defined by X-type 1, the X-type of a bit permutation (X, $b_2$, $b_3$) is defined by X-type 2, the X-type of a bit permutation ($b_1$, X, $b_3$) is defined by X-type 3, the X-type of a bit permutation ($b_1$, $b_2$, X) is defined by X-type 4, the X-type of a bit permutation ($b_1$, X, X) is defined by X-type 5, the X-type of a bit permutation (X, $b_2$, X) is defined by X-type 6, the X-type of a bit permutation (X, X, $b_3$) is defined by X-type 7, and the X-type of a bit permutation (X, X, X) is defined by X-type 8.

12. The test vector generating program of a semiconductor logic circuit device as set forth in claim 10, wherein said first total capture state transition number calculating processing calculates a first total capture state transition number $TECTA_1$ by $$TECTA_1 = ECT_1 + PCT_1 \cdot k$$

where $ECT_1$ is the number of bit pairs where the logic value of a bit of the pseudo external input lines of said first combinational portion is different from the logic value of a respective bit of the pseudo external output lines of said first combinational portion, $PCT_1$ is the number of bit pairs where at least one of a bit of the pseudo external input lines of said first combinational portion and a respective bit of the pseudo external output lines of said first combinational portion is an don't-care value, and k is a weight coefficient, and wherein said second total capture state transition number calculating step calculates a second total capture state transition number $TECTA_2$ by $$TECTA_2 = ECT_2 + PCT_2 \cdot k$$

where $ECT_2$ is the number of bit pairs where the logic value of a bit of the pseudo external input lines of said second combinational portion is different from the logic value of a respective bit of the pseudo external output lines of said second combinational portion, $PCT_2$ is the number of bit pairs where at least one of a bit of the pseudo external input lines of said second combinational portion and a respective bit of the pseudo external output lines of said second combinational portion is an don't-care value, and k is a weight coefficient.

13. The test vector generating program of a semiconductor logic circuit device as set forth in claim 10, wherein said second filling processing comprises:

a second justifying easiness calculating processing adapted to calculate a second justifying easiness ($JE_2$) for each bit permutation of X-types 3 to 8;

a second target bit permutation selecting processing adapted to select one of said bit permutations of X-types 3 to 8 having a maximum second justifying easiness ($JE_2$) as a target bit permutation;

a third justifying operation processing adapted to decide 0 or 1 in an don't-care bit of said test cube so that a logic value of the second bit of said target bit permutation may appear in the third bit of said target bit permutation, when said target bit permutation is X-type 4 or 6 and so that a logic value of the third bit of said target bit permutation may appear in the second bit of said target bit permutation, when said target bit permutation is X-type 3 or 7;

a fourth justifying operation processing adapted to decide 0 or 1 in an don't-care bit of said test cube so that a logic value opposite to the logic value of the second bit of said target bit permutation may appear in the third bit of said target bit permutation, when said target bit permutation is X-type 4 or 6 and so that a logic value opposite to the logic value of the third bit of said target bit permutation may appear in the second bit of said target bit permutation, when said target bit permutation is X-type 3 or 7, when said third justifying operation processing has failed;

a fifth justifying operation processing adapted to decide 0 or 1 in an don't-care bit of said test cube so that a third logic value may appear in the second and third bits of said target bit permutation, when said target bit permutation is X-type 5 or 8;

a sixth justifying operation processing adapted to decide 0 or 1 in an don't-care bit of said test cube so that a fourth logic value opposite to the said third logic value may appear in the second and third bits of said target bit permutation, when said fifth justifying operation processing has failed;

a seventh justifying operation processing adapted to decide 0 or 1 in an don't-care bit of said external input lines or said test cube so that one (logic value C) of said third and fourth logic values to the second bit of said target bit permutation and so that the other (logic value D) of said third and fourth logic values may appear in the third bit of said target bit permutation, when said sixth justifying operation processing has failed; and an eighth justifying operation processing adapted to decide 0 or 1 in an don't-care bit of said external input lines or said test cube so that assign said logic value D to the second bit of said target bit permutation and so that said logic value C may appear in the third bit of said target bit permutation, when said seventh justifying operation processing has failed.

14. The test vector generating program of a semiconductor logic circuit device as set forth in claim 13, wherein said second justifying easiness calculating processing calculates said second justifying easiness in accordance with a mean distance to don't-care bits of said external input lines and said pseudo external input lines from a set of don't-care bits except for the first bit of each of bit permutation of X-types 3 to 8.

15. The test vector generating program of a semiconductor logic circuit device as set forth in claim 10, wherein said first filling processing comprises:

an assigning processing adapted to select one or a plurality of bit permutations of X-type 2 or 6 as target bit permutations when there are bit permutations of X-type 2 or 6, and assign logic values of the second bits of said target bit permutations to the first bits of said target bit permutations;

a first justifying easiness calculating processing adapted to calculate a first justifying easiness ($JE_1$) for each bit permutation of X-types 3, 5, 7 and 8 when there is no bit permutation of X-type 2 or 6;

a first target bit permutation selecting processing adapted to select one of said bit permutations of X-types 3, 5, 7 or 8 having a maximum first justifying easiness ($JE_1$) as a target bit permutation when there is no bit permutation of X-type 2 or 6;

a first justifying operation processing adapted to decide 0 or 1 in an don't-care bit of said test cube so that a logic value of the first bit of said target bit permutation may appear in the second bit of said target bit permutation, when said target bit permutation is X-type 3 or 5;

a second justifying operation processing adapted to decide 0 or 1 in an don't-care bit of said test cube so that an opposite value of the logic value of the first bit of said target bit permutation may appear in the second bit of said target bit permutation, when said first justifying operation processing has failed;

a first assigning/justifying operation processing adapted to assign a first logic value to the first bit of said target bit permutation and decide 0 or 1 in an don't-care bit of said test cube so that said first logic value may appear in the second bit of said target bit permutation, when said target bit permutation is X-type 7 or 8;

a second assigning/justifying operation processing adapted to assign a second logic value opposite to said first logic value to the first bit of said target bit permutation and decide 0 or 1 in an don't-care bit of said test cube so that said second logic value may appear in the second bit of said target bit permutation, when said first assigning/justifying operation processing has failed;

a third assigning/justifying operation processing adapted to assign one (logic value A) of first and second logic values to the first bit of said target bit permutation and decide 0 or 1 in an don't-care bit of said test cube so that the other (logic value B) of said first and second logic values may appear in the second bit of said target bit permutation, when said second assigning/justifying operation processing has failed; and a fourth assigning/justifying operation processing adapted to assign said logic value B to the first bit of said target bit permutation and decide 0 or 1 in an don't-care bit of said test cube so that said logic value B may appear in the second bit of said target bit permutation, when said third assigning/justifying operation processing has failed.

16. The test vector generating program of a semiconductor logic circuit device as set forth in claim 15, wherein said first justifying easiness calculating processing calculates said first justifying easiness in accordance with a mean distance from don't-care bits of said external input lines and said pseudo external input lines to the second bit of the each of bit permutation of X-types 3, 5, 7 and 8.

* * * * *